United States Patent
Thach et al.

(10) Patent No.: US 10,534,621 B2
(45) Date of Patent: Jan. 14, 2020

(54) INFORMATION PROCESSING APPARATUS, PLD MANAGEMENT PROGRAM AND PLD MANAGEMENT METHOD

(71) Applicant: FUJITSU LIMITED, Kawasaki-shi, Kanagawa (JP)

(72) Inventors: David Thach, Boulogne-Billancourt (FR); Hisanori Fujisawa, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 170 days.

(21) Appl. No.: 15/901,931

(22) Filed: Feb. 22, 2018

(65) Prior Publication Data

US 2018/0246735 A1 Aug. 30, 2018

(30) Foreign Application Priority Data

Feb. 27, 2017 (JP) ................................. 2017-034302

(51) Int. Cl.
G06F 15/78 (2006.01)
G06F 9/445 (2018.01)
G06F 17/50 (2006.01)

(52) U.S. Cl.
CPC ...... *G06F 9/44505* (2013.01); *G06F 15/7871* (2013.01); *G06F 17/505* (2013.01)

(58) Field of Classification Search
CPC ................................................ G06F 15/7871
See application file for complete search history.

(56) References Cited

U.S. PATENT DOCUMENTS

| 2014/0215424 A1* | 7/2014 | Fine ............... G06F 17/5054 716/117 |
| 2015/0186158 A1* | 7/2015 | Yalamanchili ...... G06F 9/44505 713/100 |
| 2015/0236696 A1 | 8/2015 | Saen et al. |

FOREIGN PATENT DOCUMENTS

| JP | 2004-032043 | 1/2004 |
| JP | 2015-154417 | 8/2015 |
| JP | 2015-231205 | 12/2015 |
| JP | 2016-076867 | 5/2016 |

* cited by examiner

*Primary Examiner* — Albert Wang
(74) *Attorney, Agent, or Firm* — Fujitsu Patent Center

(57) ABSTRACT

An information processing apparatus has a processor and a programmable logic circuit device (PLD) that includes a reconfiguration region to configure a logic circuit requested by a configuration request from the processor. The processor compares a first execution time of a plurality of the logic circuits for a case when a degree of parallelism adjustment is performed by decreasing a degree of parallelism of a first logic circuit and increasing a degree of parallelism of a second logic circuit and a second execution time of the plurality of logic circuits for a case when the degree of parallelism adjustment is not performed, and requests the degree of parallelism adjustment to the PLD when the first execution time is shorter than the second execution time, and does not request the degree of parallelism adjustment to the PLD when the first execution time is not shorter than the second execution time.

11 Claims, 17 Drawing Sheets

| | UC_1 | UC_2 | UC_3 | UC_4 |
|---|---|---|---|---|
| DEGREE OF PARALLELISM   P | P1 | P2 | P3 | P4 |
| ESTIMATED CONFIGURATION TIME CT_E | CT_E1 | CT_E2 | CT_E3 | CT_E4 |
| ESTIMATED EXECUTION TIME ET_E | ET_E1 | ET_E2 | ET_E3 | ET_E4 |
| ESTIMATED USED BAND BD_E | BD_E1 | BD_E2 | BD_E3 | BD_E4 |
| MEASURED EXECUTION TIME ET_M | ET_M1 | ET_M2 | ET_M3 | ET_M4 |
| MEASURED USED BAND BD_M | BD_M1 | BD_M2 | BD_M3 | BD_M4 |
| CIRCUIT TYPE (PROCESSING PATTERN) | CI | DI | DI | CI |
| NUMBER OF TIMES OF EXECUTION OF CIRCUIT | N_1 | N_2 | N_3 | N_4 |
| NUMBER OF DATA SETS PROCESSED IN ONE EXECUTION | S_1 | S_2 | S_3 | S_4 |
| INPUT DATA READ TIME | $T_{LD\_1}$ | - | - | $T_{LD\_4}$ |
| OUTPUT DATA WRITE TIME | $T_{ST\_1}$ | - | - | $T_{ST\_4}$ |
| PROCESSING TIME FOR ONE DATA SET | $T_{COMP\_SINGLE\_1}$ | - | - | $T_{COMP\_SINGLE\_4}$ |
| INITIATION INTERVAL TIME | $T_{II\_1}$ | - | - | $T_{II\_4}$ |

FPGA BUS BAND UPPER LIMIT VALUE BD_L

FIG. 6
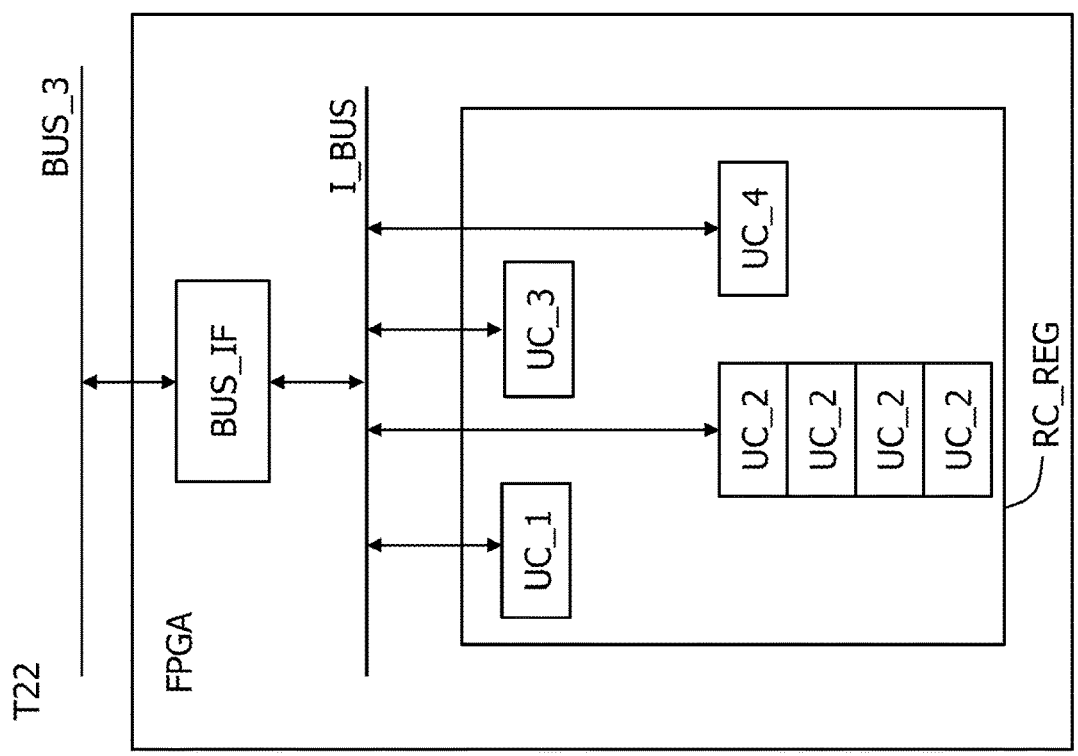
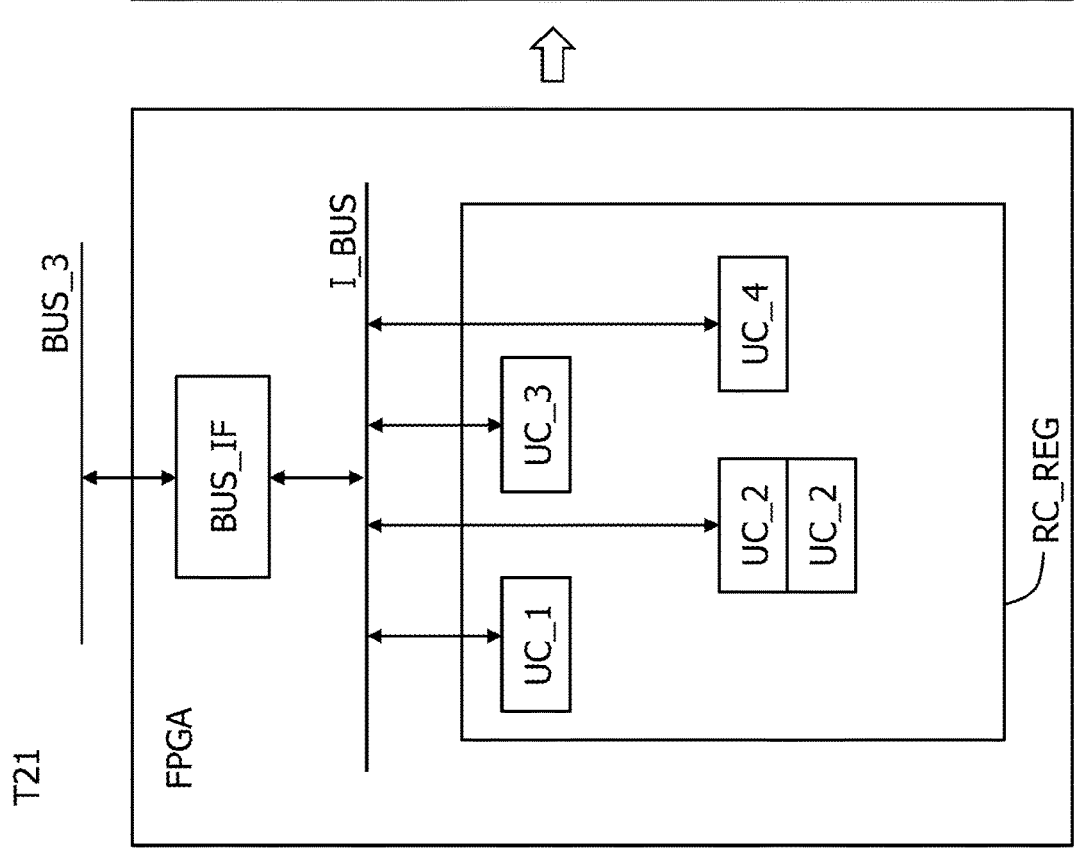

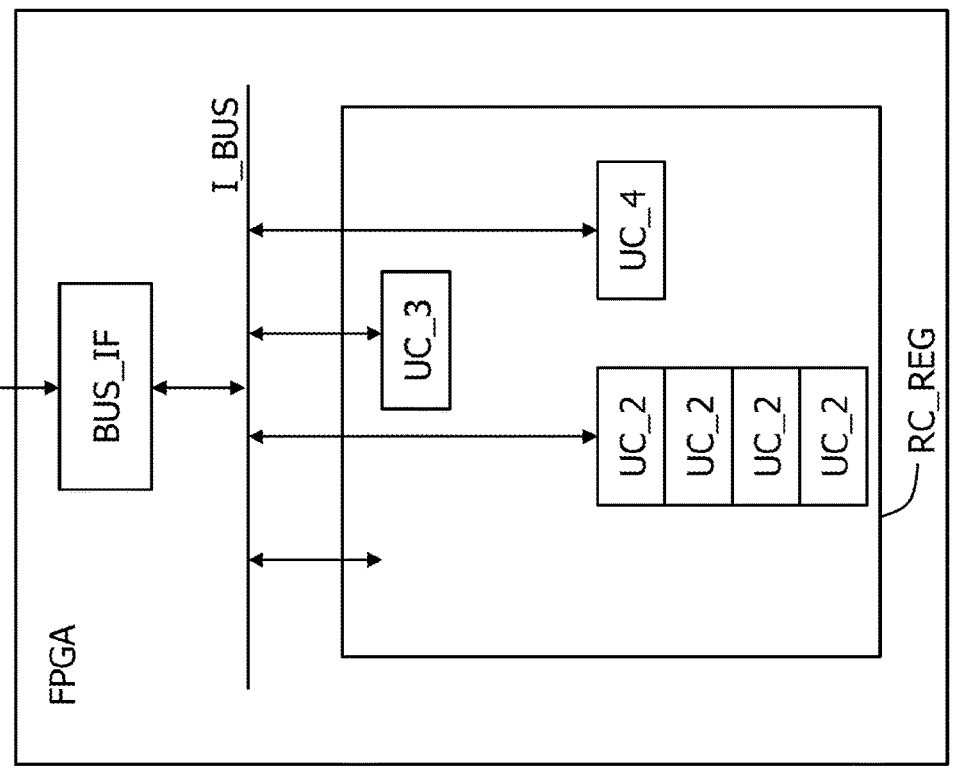
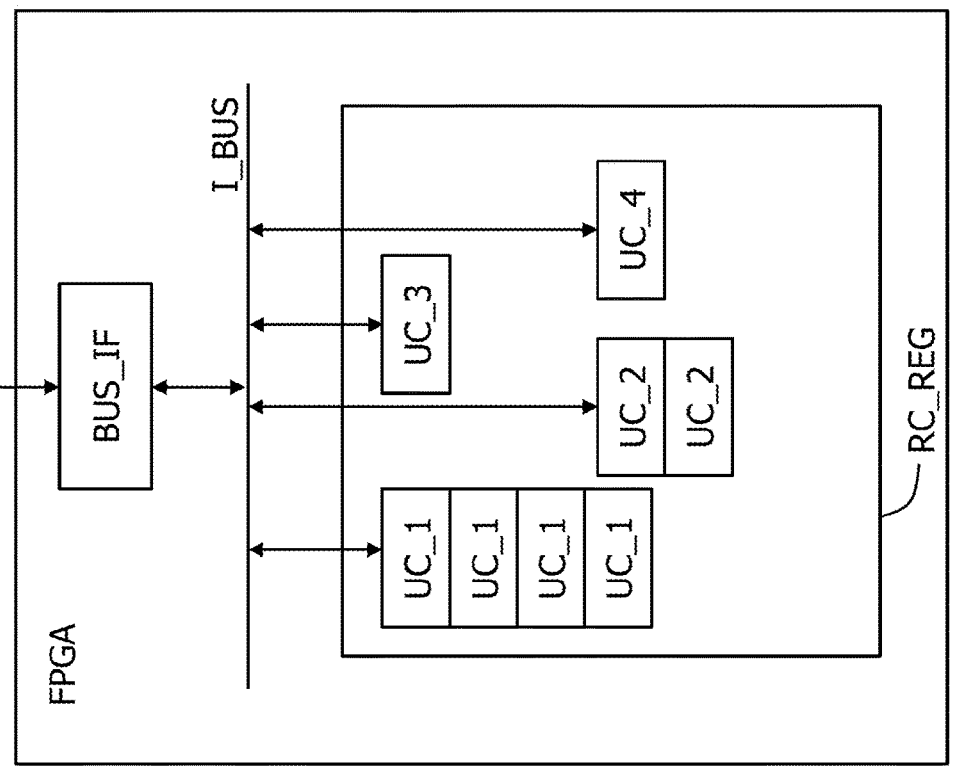
FIG. 7

FIG. 11

| | UC_1 | UC_2 | UC_3 | UC_4 |
|---|---|---|---|---|
| DEGREE OF PARALLELISM P | P1 | P2 | P3 | P4 |
| ESTIMATED CONFIGURATION TIME CT_E | CT_E1 | CT_E2 | CT_E3 | CT_E4 |
| ESTIMATED EXECUTION TIME ET_E | ET_E1 | ET_E2 | ET_E3 | ET_E4 |
| ESTIMATED USED BAND BD_E | BD_E1 | BD_E2 | BD_E3 | BD_E4 |
| MEASURED EXECUTION TIME ET_M | ET_M1 | ET_M2 | ET_M3 | ET_M4 |
| MEASURED USED BAND BD_M | BD_M1 | BD_M2 | BD_M3 | BD_M4 |
| CIRCUIT TYPE (PROCESSING PATTERN) | CI | DI | DI | CI |
| NUMBER OF TIMES OF EXECUTION OF CIRCUIT | N_1 | N_2 | N_3 | N_4 |
| NUMBER OF DATA SETS PROCESSED IN ONE EXECUTION | S_1 | S_2 | S_3 | S_4 |
| INPUT DATA READ TIME | $T_{LD\_}1$ | - | - | $T_{LD\_}4$ |
| OUTPUT DATA WRITE TIME | $T_{ST\_}1$ | - | - | $T_{ST\_}4$ |
| PROCESSING TIME FOR ONE DATA SET | $T_{COMP\_SINGLE\_}1$ | - | - | $T_{COMP\_SINGLE\_}4$ |
| INITIATION INTERVAL TIME | $T_{II\_}1$ | - | - | $T_{II\_}4$ |

FPGA BUS BAND UPPER LIMIT VALUE BD_L

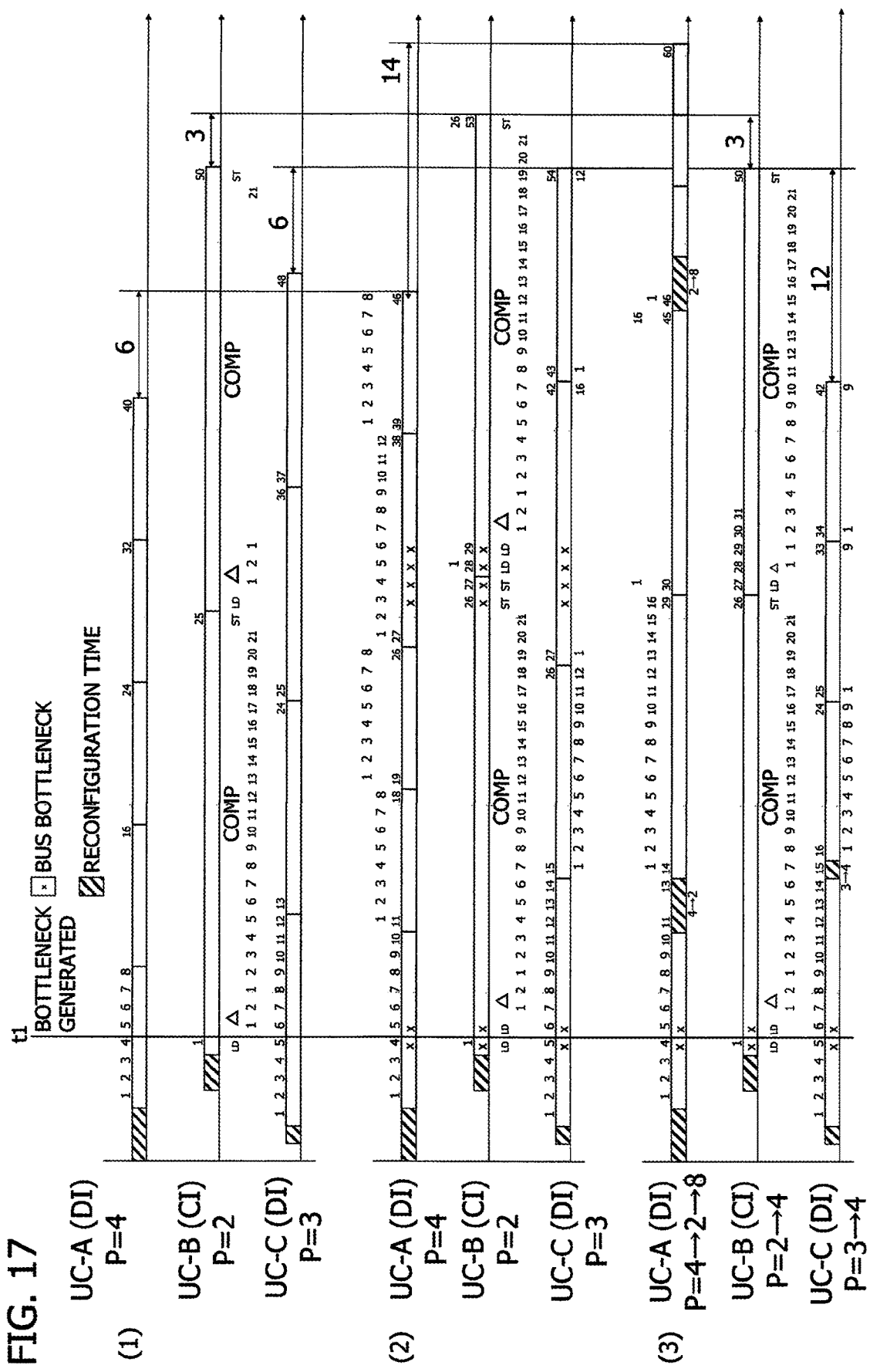

INFORMATION PROCESSING APPARATUS, PLD MANAGEMENT PROGRAM AND PLD MANAGEMENT METHOD

CROSS-REFERENCE TO RELATED APPLICATION

This application is based upon and claims the benefit of priority of the prior Japanese Patent Application No. 2017-034302, filed on Feb. 27, 2017, the entire contents of which are incorporated herein by reference.

FIELD

The present invention relates to an information processing apparatus, a PLD management program, and a PLD management method.

BACKGROUND

When configuration data, to configure a circuit which can execute a predetermined processing, is set or written to an integrated circuit in which a plurality of logic circuit elements, memory circuit elements, wires, switches and the like are formed in advance, a programmable logic device (hereafter PLD) reconfigures the circuit which can execute the predetermined processing. This PLD is, for example, a field programmable gate array (FPGA), and is an LSI which can reconfigure internal circuits into various logic circuits by overwriting the configuration data. The PLD will now be described using an FPGA as an example.

To execute a predetermined software processing (e.g. job) using a dedicated hardware circuit, the processor configures a dedicated circuit in the FPGA by setting or writing the configuration data to configure the dedicated circuit to the FPGA, so that the dedicated circuit executes the predetermined processing. When the dedicated circuit ends the predetermined processing, the processor configures another dedicated circuit to execute a different processing in the FPGA by setting or writing the configuration data of this dedicated circuit to the FPGA, so that this dedicated circuit executes the different processing. By the processor causing a dedicated circuit of the FPGA to execute a predetermined software processing, so that the FPGA is used as an accelerator of the processor. Thereby the power of the information processing apparatus (computer) including the processor can be saved, and the functions thereof can be improved.

As the scale of the FPGA increases, a plurality of logic circuits can now be configured in the FPGA, and the plurality of logic circuits can be operated in parallel. Further, a plurality of logic circuits can be asynchronously and dynamically reconfigured and operated asynchronously in parallel, such as reconfiguring a part of the logic circuit and starting the operation of new logic circuits while running a plurality of logic circuits configured in the FPGA.

Configuring a plurality of circuits in an FPGA is disclosed in Japanese Laid-open Patent Publication No. 2015-154417, No. 2004-32043, No. 2016-76867 and No. 2015-231205, and Japanese Patent Application No. 2016-248297. Japanese Patent Application No. 2016-248297 is an application, but is not a publically known example.

SUMMARY

On the other hand, when a plurality of users use an information processing apparatus that includes a processor and an FPGA, a plurality of logic circuits configured in the FPGA may process a specific processing of programs of the plurality of users respectively. In this case, the programs of a plurality of users respectively configure logic circuits in the FPGA, without considering other logic circuits, and the configured plurality of logic circuits partially and dynamically share the FPGA. As a result, in some cases, a used band of the bus between the FPGA and the memory reaches the upper limit value of the bus band, and a bottleneck is generated on the bus band.

When a bottleneck is generated on the bus band, a degree of parallelism of a predetermined logic circuit may be decreased, and a degree of parallelism of another logic circuit may be increased instead, so as to suppress an increase in overall execution time. How to decrease the execution time when a degree of parallelism is increased differs depending on the type of logic circuit.

An first aspect of the embodiment is an information processing apparatus, including: a processor that executes a program; and a programmable logic circuit device (herein after called PLD) that includes a reconfiguration region to, in response to a configuration request from the processor, configure a logic circuit requested by the configuration request, wherein the processor compares a first execution time of a plurality of the logic circuits for a case when a degree of parallelism adjustment is performed by decreasing a degree of parallelism of a first logic circuit and increasing a degree of parallelism of a second logic circuit, out of the plurality of logic circuits, which are configured in the reconfiguration region and operates, and a second execution time of the plurality of logic circuits for a case when the degree of parallelism adjustment is not performed, and requests the degree of parallelism adjustment to the PLD when the first execution time is shorter than the second execution time, and does not request the degree of parallelism adjustment to the PLD when the first execution time is not shorter than the second execution time.

According to the first aspect, the utilization efficiency of the circuit resources of the PLD can be improved.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 is a diagram depicting a bottleneck of the bus band in the FPGA.

FIG. 7 is a diagram depicting an example of controlling the degree of parallelism using the FPGA management method according to Embodiment 1.

FIG. 11 is a table of parameters of the user circuit managed by the processor.

FIG. 17 is a diagram depicting a second example.

DESCRIPTION OF THE EMBODIMENTS

Figure 1:
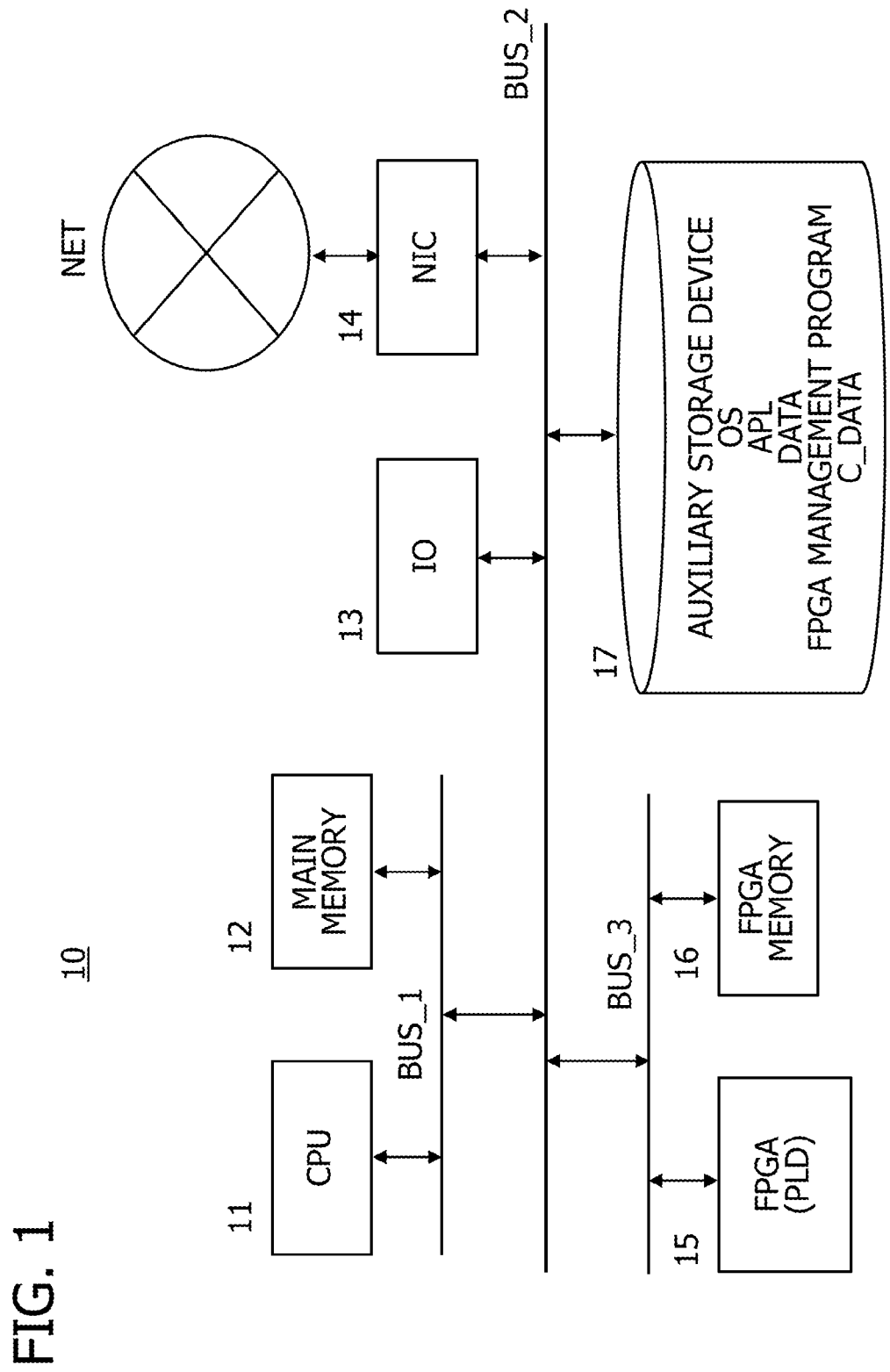
FIG. 1 is a diagram depicting a configuration example of an information processing apparatus according to this embodiment.

FIG. 1 is a diagram depicting a configuration example of an information processing apparatus according to this embodiment. A server 10, which is the information processing apparatus, includes a first bus BUS_1 (e.g. CPU bus) which connects a processor or a central processing unit (CPU) 11 that executes the OS, an application program and a middleware program, and a main memory 12 (e.g. DRAM). Further, the server 10 includes an I/O device (e.g. mouse, keyboard, display panel) 13, a network interface card (NIC) 14 connected to a network NET, and an auxiliary storage device 17, such as a hard disk drive (HDD) and a solid-state drive (SSD), that stores the OS, application programs APL, data DATA and the like. These components and the first bus BUS_1 are connected via a second bus BUS_2 (e.g. PCI bus).

The server 10 further includes a programmable logic drive (PLD) 15 that reconfigures an arbitrary logic circuit, a memory 16 that stores configuration data of the PLD and the like, and a third bus BUS_3 that is a bus for connecting these components. The PLD is an FPGA, the memory 16 is an FPGA memory, and the third bus is an FPGA bus, for example.

When a job management program of the OS, which the CPU 11 executes, detects a job that can be processed by a logic circuit in the FPGA, in the executing application program, the CPU configures the logic circuit by writing (or setting) configuration data, to configure the logic circuit, in the FPGA, and the logic circuit executes the job.

In the auxiliary storage device 17, an FPGA management program, to manage the FPGA, and a configuration data C_DATA, to configure the logic circuit, are stored. When the server 10 starts up, the OS, the application APL and the FPGA management program in the auxiliary storage device are developed in the main memory 12, and are executed by the processor 11. The configuration data C_DATA in the auxiliary storage device is developed in an FPGA memory.

FPGA 15 can configure various logic circuits by changing the configuration data, hence even after the server 10 is manufactured, various jobs can be processed at high-speed by a logic circuit configured in the FPGA by changing the configuration data.

In a cloud-based service, for example, a plurality of users cause the server 10 to execute the respective application programs. As a result, the processor 11 of the server 10 executes the application programs of a plurality of users in parallel. Each logic circuit which executes a predetermined processing (job) of the application program is asynchronously constructed in the FPGA 15, and the plurality of constructed logic circuits (user circuits) operate in parallel, and execute the respective predetermined processing (job).

Figure 2:
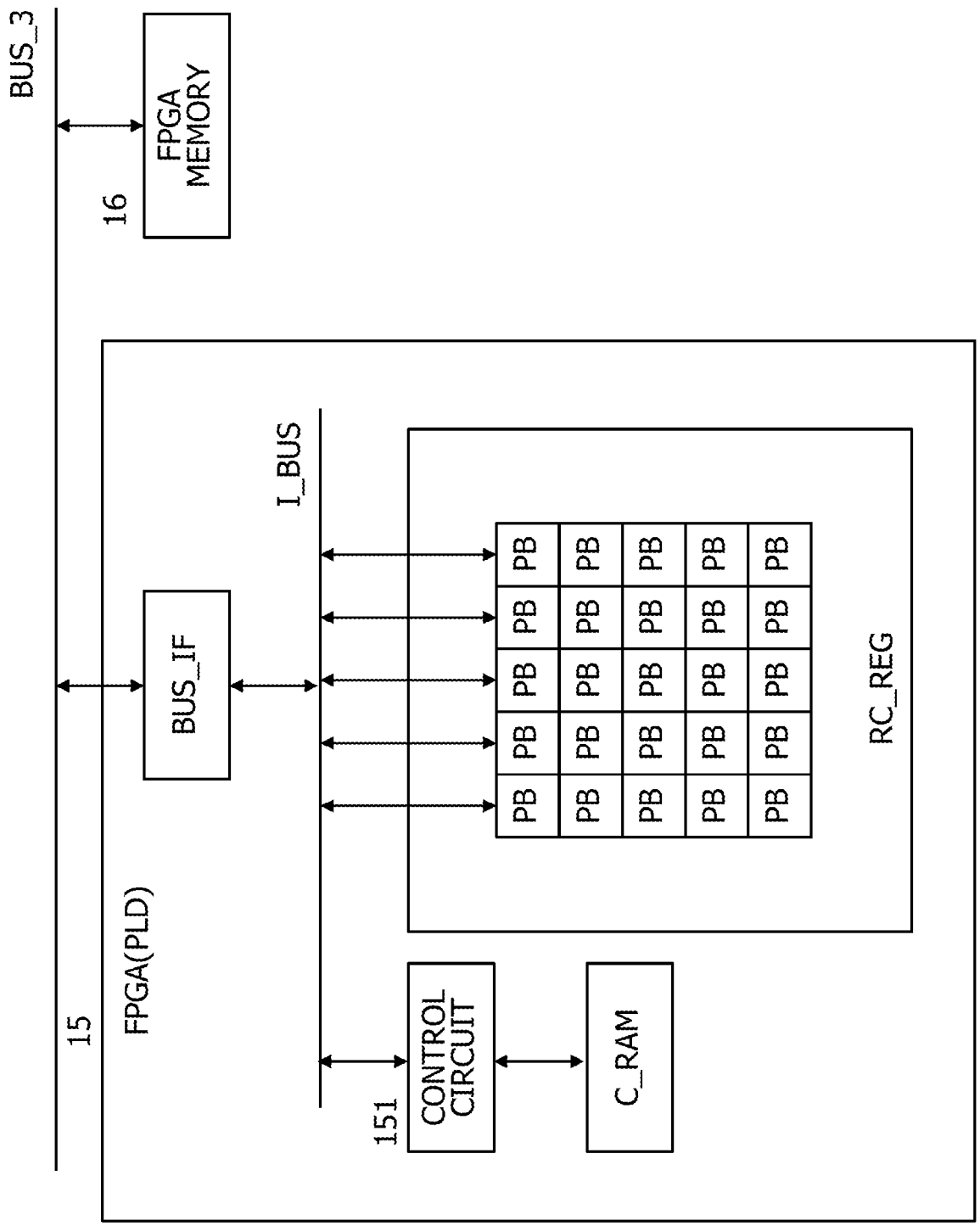
FIG. 2 is a diagram depicting a configuration example of FPGA.

FIG. 2 is a diagram depicting a configuration example of FPGA. The FPGA 15 in FIG. 2 includes: a bus interface circuit BUS_IF with the third bus BUS_3 of the FPGA; a control circuit 151 that performs write control of the configuration and other controls; a configuration data memory C_RAM in which the configuration data is written; a reconfiguration region RC_REG in which various logic circuits are reconfigured by the written configuration data; and an internal bus I_BUS.

In the reconfiguration region RC_REG, a plurality of logic circuit elements, memory circuit elements, wires, switches and the like are formed in advance (not illustrated). The reconfiguration region RC_REG is divided into a plurality of partial reconfiguration blocks PB, which are logically or physically divided. The logic circuit that is reconfigured is configured in a single or plurality of partial reconfiguration blocks by using a circuit block that can be configured in each partial reconfiguration block PB as a configuration unit. Therefore the configuration data memory C_RAM is divided into a plurality of storage regions corresponding to a plurality of partial reconfiguration blocks PB, for example, and when the configuration data C_DATA is written in each storage region, each logic circuit is configured in the partial reconfiguration block PB corresponding to this storage region.

In some cases, a logic circuit (user circuit), which executes a certain job, is configured in a plurality of partial reconfiguration blocks PB. In this case, configuration data, to configure the logic circuit, is written in the storage regions corresponding to a plurality of partial reconfiguration blocks respectively, and the logic circuit (user circuit), to execute the processing of the job, is configured by a plurality of circuits configured in each of the partial reconfiguration blocks.

As mentioned above, the reconfiguration region RC_REG in the FPGA is configured using the plurality of partial reconfiguration blocks PB. A logic circuit, which executes a predetermined processing (job) in the application program of each user, is configured in a single partial reconfiguration block PB in some cases, and is configured in a plurality of partial reconfiguration blocks PB in other cases.

Input data is input to the logic circuit, which is configured in the reconfiguration region RC_REG, from the CPU via the bus interface BUS_IF, and the processed result of the input data is output to the CPU. A plurality of logic circuits configured in the reconfiguration region RC_REG transmit/receive the operating data to/from the FPGA memory 16 via the internal bus I_BUS, the bus interface BUS_IF and the FPGA bus BUS_3.

Figure 3:
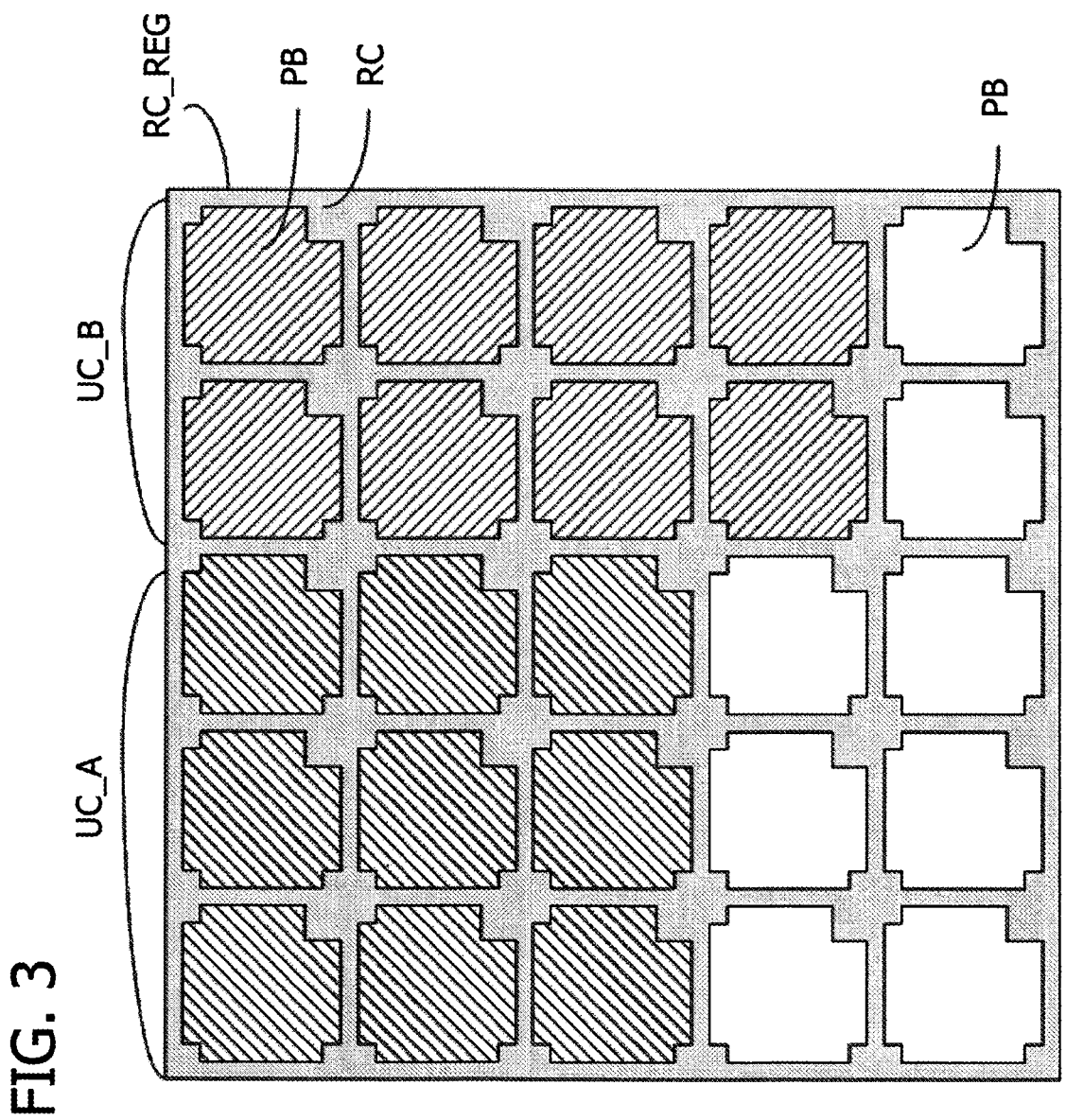
FIG. 3 is a diagram depicting an example of the reconfiguration region of the FPGA.

FIG. 3 is a diagram depicting an example of the reconfiguration region of the FPGA. As illustrated in FIG. 2, the reconfiguration region RC_REG is divided into a plurality of partial reconfiguration blocks PB arrayed in a matrix. The reconfiguration region RC_REG includes a routing circuit RC to transfer data among the plurality of logic circuits which are configured in the plurality of partial reconfiguration blocks PB, and to transfer data between the bus interface BUS_IF in FIG. 2 and the logic circuit that is configured in the partial reconfiguration block PB. The routing circuit RC includes network wiring, network switches, routing circuits and the like.

In the case of FIG. 3, out of the plurality of partial reconfiguration blocks PB, the logic circuit UC_A of user A is configured by the circuit configured in 3×3 partial reconfiguration blocks PB illustrated on the left, and the logic circuit UC_B of user B is configured by the circuit configured in 2×4 partial reconfiguration blocks PB illustrated on the right. 8 partial reconfiguration blocks PB, in which the circuit is not configured, are indicated with no color.

Figure 4:
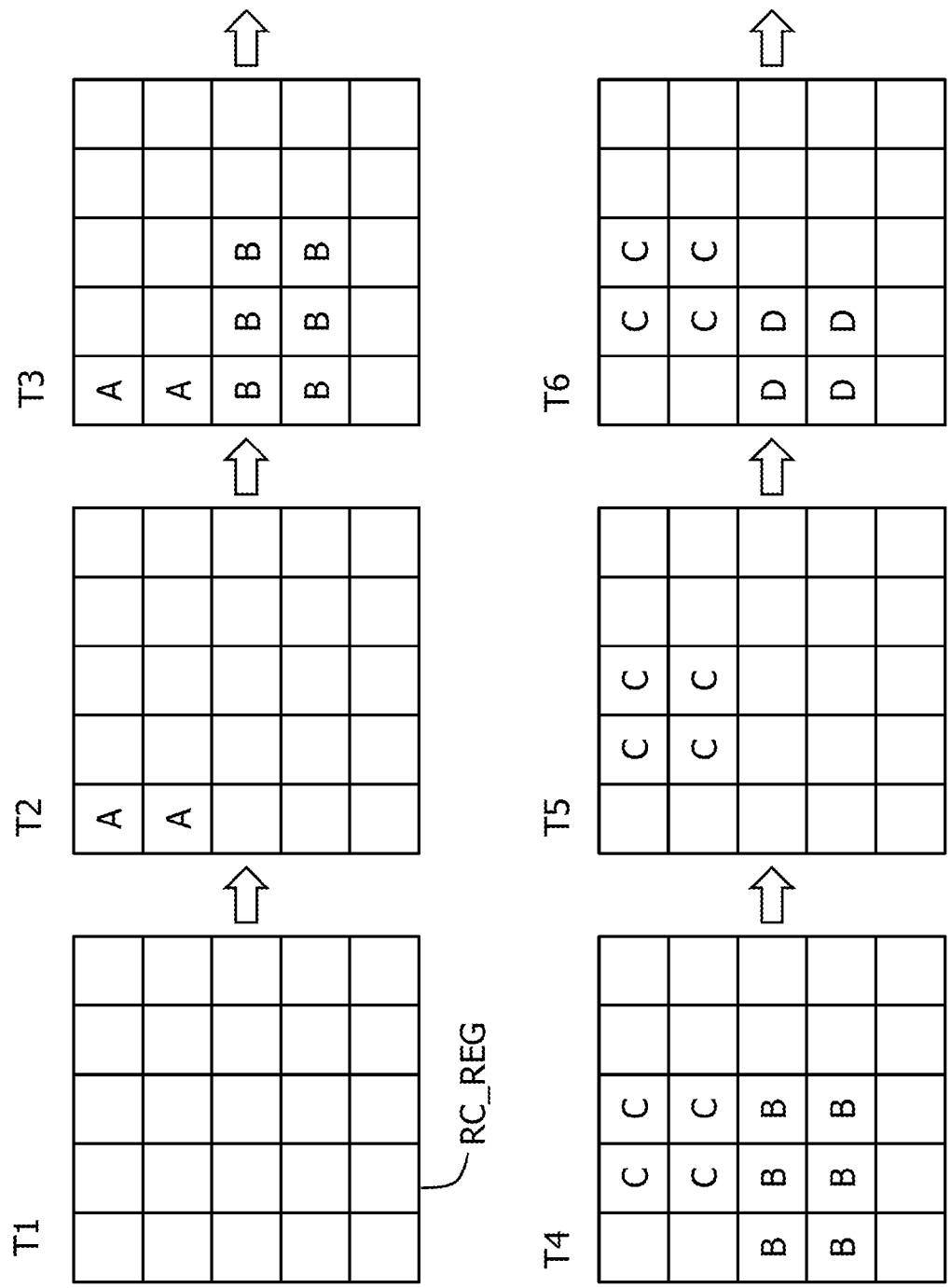
FIG. 4 is a diagram depicting an example when the logic circuits of a plurality of users are dynamically configured and deleted.

FIG. 4 is a diagram depicting an example when the logic circuits of a plurality of users are dynamically configured and deleted. At time T1, a logic circuit is not configured in the reconfiguration region RC_REG in the FPGA. Then at time T2, the logic circuit of user A is configured in two partial reconfiguration blocks, and starts job execution. Then at time T3, the logic circuit of user B is configured in six partial reconfiguration blocks, and starts job execution. After time T3, the logic circuit of user A completes processing, and at time T4, the logic circuit of user C is configured in four partial reconfiguration blocks, and starts job execution. Then at time T5, the logic circuit of user B completes processing, and at time T6, the logic circuit of user D is configured in four partial reconfiguration blocks, and starts job execution. When processing ends, the partial reconfiguration blocks, in which the logic circuit was configured, are released so that another logic circuit can be configured, for example. In this case, it is preferable that the configuration data in the configuration data memory C_RAM is not deleted until another logic circuit is configured in the released partial reconfiguration blocks, for example, and if a configuration request for the same circuit is generated again, the configured logic circuit becomes active again.

As illustrated in FIG. 4, logic circuits of a user or of different users are asynchronously configured in the reconfiguration region of the FPGA, and each configured logic circuit executes a job. The FPGA management program on the server 10 performs control to reconfigure the logic circuits in the FPGA.

Figure 5:
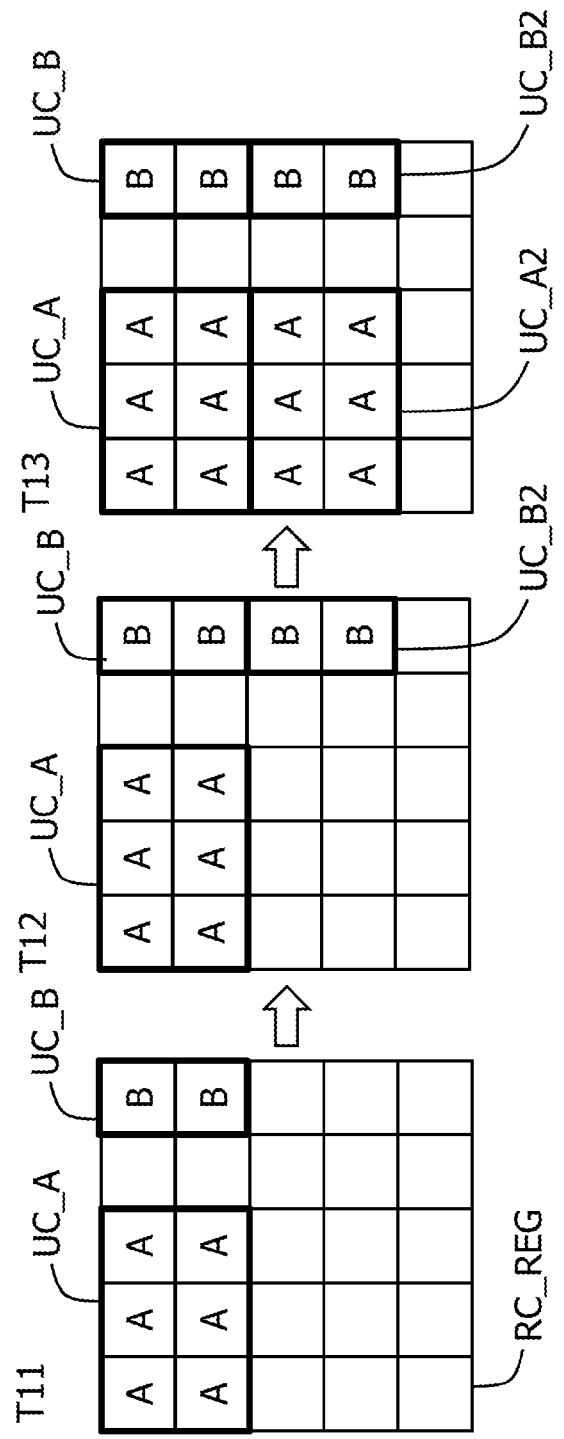
FIG. 5 is a diagram depicting an example of controlling the degree of parallelism of the logic circuits configured in the FPGA.

FIG. 5 is a diagram depicting an example of controlling the degree of parallelism of the logic circuits configured in the FPGA. In the FPGA, which is one type of PLD, a logic circuit is configured by setting configuration data, then this logic circuit executes the job, and plays the function of accelerator of the CPU. However, a logic circuit in the FPGA is configured using a lookup table and switching circuit, which are reconfigured with configuration data, hence the operation speed of this logic circuit is slower than a standard custom integrated circuit. One method of using the logic circuit in the FPGA as an accelerator of the CPU is configuring a plurality of the same logic circuits in the FPGA, and operating the plurality of logic circuits in parallel.

For example, when a logic circuit, which executes a processing of a certain job, is configured in the FPGA, the processor that executes the FPGA management program controls the FPGA so as to configure a plurality of same logic circuits in the reconfiguration region RC_REG if space is available, causing the plurality of same logic circuits to execute jobs in parallel.

In the case of FIG. 5, at time T11, the processor, which executes the FPGA management program, configures the logic circuit UC_A of user A in six partial reconfiguration blocks, and configures the logic circuit US_B of user B in two partial reconfiguration blocks. Then at time T12, the processor configures the second logic circuit UC_B2 of user B in two partial reconfiguration blocks, and causes the two logic circuits, UC_B and UC_B2, to perform parallel processing. In the same manner, at time T13, the processor configures the second logic circuit UC_A2 of user A in six partial reconfiguration blocks, and causes the two logical circuits, UC_A and UC_A2, to perform parallel processing. Thereby the operation speed of the logic circuits in the FPGA can be increased.

For example, in the case when a logic circuit of a user is used as an adder, and one adder completes operation in N cycle, two adders are configured to perform addition operation in parallel, then operation is completed in N/2 cycles. This is an example of decreasing the execution time of a job by increasing the degree of parallelism of a logic circuit.

Bottleneck of Bus Band

FIG. 6 is a diagram depicting a bottleneck of the bus band in the FPGA. The logic circuits configured in the FPGA access the FPGA memory 16, depicted in FIGS. 1 and 2, via the FPGA bus BUS_3. In the FPGA memory 16, a configuration data of the logic circuit to be reconfigured and data that the configured logic circuit accesses are stored. Therefore when the processor, that executes the FPGA management program, requests to configure a logic circuit in the FPGA, the control circuit in the FPGA accesses the FPGA memory, and downloads the configuration data of the logic circuit. Further, when the logic circuits configured in the FPGA execute the respective jobs, each logic circuit accesses the data stored in the FPGA memory. Therefore each logic circuit configured in the FPGA uses a band corresponding to the data transfer amount of this logic circuit, out of the bands which the FPGA bus BUS_3 can provide.

In the case of FIG. 6, at time T21, user circuits UC_1, UC_3 and UC_4 of users 1, 3 and 4 are configured in the reconfiguration region RC_REG of the FPGA at degree 1 parallelism, and user circuit UC_2 of user 2 is configured therein at degree 2 parallelism. The band that the FPGA bus BUS_3 can provide (upper limit value of the data transfer amount) is 1350 MB/s, for example, and the average data transfer amount of the user circuits UC_1, UC_2, UC_3 and UC_4 of users 1, 2, 3 and 4 are assumed to be 100 MB/s, 200 MB/s, 200 MB/s and 300 MB/s respectively. In the state in FIG. 6, the total of the average data transfer amounts of the configured user circuits UC_1 to UC_4 is 100+200*2+200+300=1000 MB/s. Therefore the total value 1000 MB/s does not reach the upper limit value 1350 MB/s. In this state, a bottleneck is not generated in the FPGA bus BUS_3, each user circuit operates at the expected data transfer amount, and the execution time of a job is also the expected execution time.

At time T22, on the other hand, the processor that executes the FPGA management program requests the control circuit of the FPGA to increase the degree of parallelism of the logic circuit UC_2 of user 2 to 4, and the degree of parallelism of the logic circuit UC_2 is increased to 4. In this case, there is sufficient space in the partial reconfiguration blocks to increase the degree of parallelism of the logic circuit UC_2 to 4 in the reconfiguration region RC_REG, and the data transfer amount of the logic circuit UC_2 is estimated to be low, therefore the processor may estimate that the upper limit value of the bus band is not exceeded, even if the degree of parallelism is increased to 4.

Actually, however, the total value of the data transfer amounts of the operating logic circuits becomes 100+200*4+200+300=1400 MB/s, which exceeds the upper limit value 1350 MB/s of the FPGA bus, and a bottleneck may be generated on the band of the FPGA bus. As a result, if the bottleneck is generated, the logic circuit UC_2 of user 2, of which degree of parallelism is increased to 4, is unable to use the band needed to execute the job, and the execution time of one job by the logic circuit UC_2 of user 2 becomes longer than the estimated execution time.

As mentioned above, even when there is space in the partial reconfiguration blocks in the reconfiguration region RC_REG in the FPGA, the total of the data transfer amounts of the logic circuits may reach the upper limit value of the bus band, and a bottleneck may be generated in the bus band if the degree of parallelism of the logic circuits is increased, because the FPGA bus band is insufficient. As a result, performance of the logic circuits, of which degree of parallelism was increased, does not improve, and the partial reconfiguration blocks in the reconfiguration region are used wastefully.

Embodiment 1

FIG. 7 is a diagram depicting an example of controlling the degree of parallelism using the FPGA management method according to Embodiment 1. In this FPGA management method, a logic circuit of a user includes: an execution time measuring circuit which measures the execution time needed to execute one job; and a data transfer amount measuring circuit which monitors access to the FPGA bus and measures the average value of the data transfer amount per unit time of bus access. These measuring circuits can be configured by the configuration data of the FPGA. When the logic circuit of the user is configured using the configuration data, the control circuit of the FPGA also configures the measuring circuits using the configuration data. Alternatively, the measuring circuits may be formed in the partial reconfiguration blocks in advance, and used as the measuring circuits of the logic circuit that is configured in the partial reconfiguration blocks.

The processor that executes the FPGA management program acquires the measured values of the data transfer amounts of a plurality of logic circuits, which were configured in the reconfiguration region in the FPGA and are currently operating, and increases the respective degrees of parallelism of a plurality of logic circuits configured in the reconfiguration region, within a range where the total of the measured values of the acquired data transfer amounts do not exceed the upper limit value of the data transfer amount of the FPGA bus.

In Embodiment 1, when the total of the measured values of the acquired data transfer amounts reach the upper limit value of the data transfer amount of the FPGA bus or is close to the upper limit value, the processor decreases the degree of parallelism of a logic circuit that satisfies a predetermined condition, out of the plurality of logic circuits. Then the processor increases the degree of parallelism of one of the logic circuits, other than the logic circuit of which degree of parallelism was decreased within a range not exceeding the upper limit value of the data transfer amount of the FPGA bus. Thereby the operation of the logic circuit, of which degree of parallelism was increased, can end at a time shorter than estimated. After ending the operation of another logic circuit of which degree of parallelism was increased, the processor increases the degree of parallelism of the logic circuit, of which degree of parallelism was decreased, within a range not exceeding the upper limit value. Thereby the operation of the logic circuit is expected to end at a time shorter than estimated.

In the case of FIG. 7, the processor acquires the measured values of the data transfer amount of the logic circuits which are operating in the state at time T22 in FIG. 6, and detects that the total thereof has reached the threshold value of the FPGA bus. Then, as indicated in time T23 in FIG. 7, the processor decreases the degree of parallelism of the logic circuit UC_2 of user 2, which is likely to be causing the bottleneck of the bus band, from 4 to 2. Then the processor increases the degree of parallelism of the logic circuit UC_1 of user 1, of which data transfer amount is low, from 1 to 4. As a result, the total of the measured values of the data transfer amounts of the operating logic circuits becomes 100*4+200*2+200+300=1300 MB/s, which is less than the upper limit value 1350 MB/s of the FPGA bus, and a bottleneck of the bus band is cleared.

Thereby the operation time of the logic circuit UC_1 of user 1 decreases, and operation is expected to complete in a short time. When the operation of the logic circuit UC_1 of user 1 completes, the processor increases the degree of parallelism of the logic circuit UC_2 of user 2, of which degree of parallelism was decreased, from 2 to 4 with priority, as seen at time T24. Then the processor acquires the measured values of the data transfer amounts of the operating logic circuits, and detects that the total of the measured values 200*4+200+300=1300 MB/s is less than the upper limit value 1350 MB/s of the FPGA bus. In this state as well, a bottleneck of the bus band is cleared, and the logic circuits can operate adequately.

Data Processing Types CI and DI

In the case of increasing the degree of parallelism of the user circuit UC_1 at time T23 in FIG. 7, the degree of decreasing the execution time differs depending on the data processing pattern of the user circuit UC_1. For example, data processing patterns include data intensive (DI) and computation intensive (CI). Normally in the case of a DI processing circuit, an increase in the degree of parallelism decreases the execution time accordingly, but in the case of a CI processing circuit, an increase in the degree of parallelism does not decrease the execution time significantly.

In the case of the DI processing circuit, data read (load) and data write (store) are constantly generated while the circuit is operating, where the operating ratio of the load store unit (LSU), which accesses the memory of the user circuit, is high, and the used band of the bus is also wide. As a result, increasing the degree of parallelism may cause a bus bottleneck. When a bus bottleneck is generated, the performance of the DI processing circuit drops, and the execution time of the job tends to increase. In the case of the DI processing circuit, increasing the degree of parallelism to N times normally decreases the execution time to 1/N times when no bus bottleneck is generated.

In the case of the CI processing circuit, on the other hand, memory access is generated at the beginning and end of the circuit operation. In other words, the input data needed for data processing is read from the memory at the beginning of the circuit operation, and the output data after the data processing is written to memory at the end of the circuit operation. Memory access is rarely generated during data processing. Therefore in the case of the CI processing circuit, the time when the bus band is not used is relatively long, the used band of the bus is narrow, and even if a bus bottleneck is generated, the performance of the CI processing circuit does not drop, and the execution time of the job changes little. Generally in the case of the CI processing circuit, the execution time does not decrease significantly even if the degree of parallelism is increased.

At time T23 in FIG. 7, in the case when the logic circuit UC_1 of user 1 is the DI processing circuit, increasing the degree of parallelism of the logic circuit UC_1 decreases the execution time of the job in accordance with the increase rate, but in the case when the logic circuit UC_1 is the CI processing circuit, the execution time of the job does not decrease significantly even if the degree of parallelism of the logic circuit UC_1 is increased. This is because the user circuit normally has a pipeline structure, and data processing is already performed in parallel in a pipeline structure. Therefore in the case of the CI processing circuit, the execution time is decreased only at the initiation interval of the pipeline, even if the degree of parallelism of the circuit is increased. In the case of the DI processing circuit, however, if the degree of parallelism is increased, memory access during data processing is performed in parallel, and generally increasing the degree of parallelism to N times decreases the execution time to 1/N times.

Figure 8:
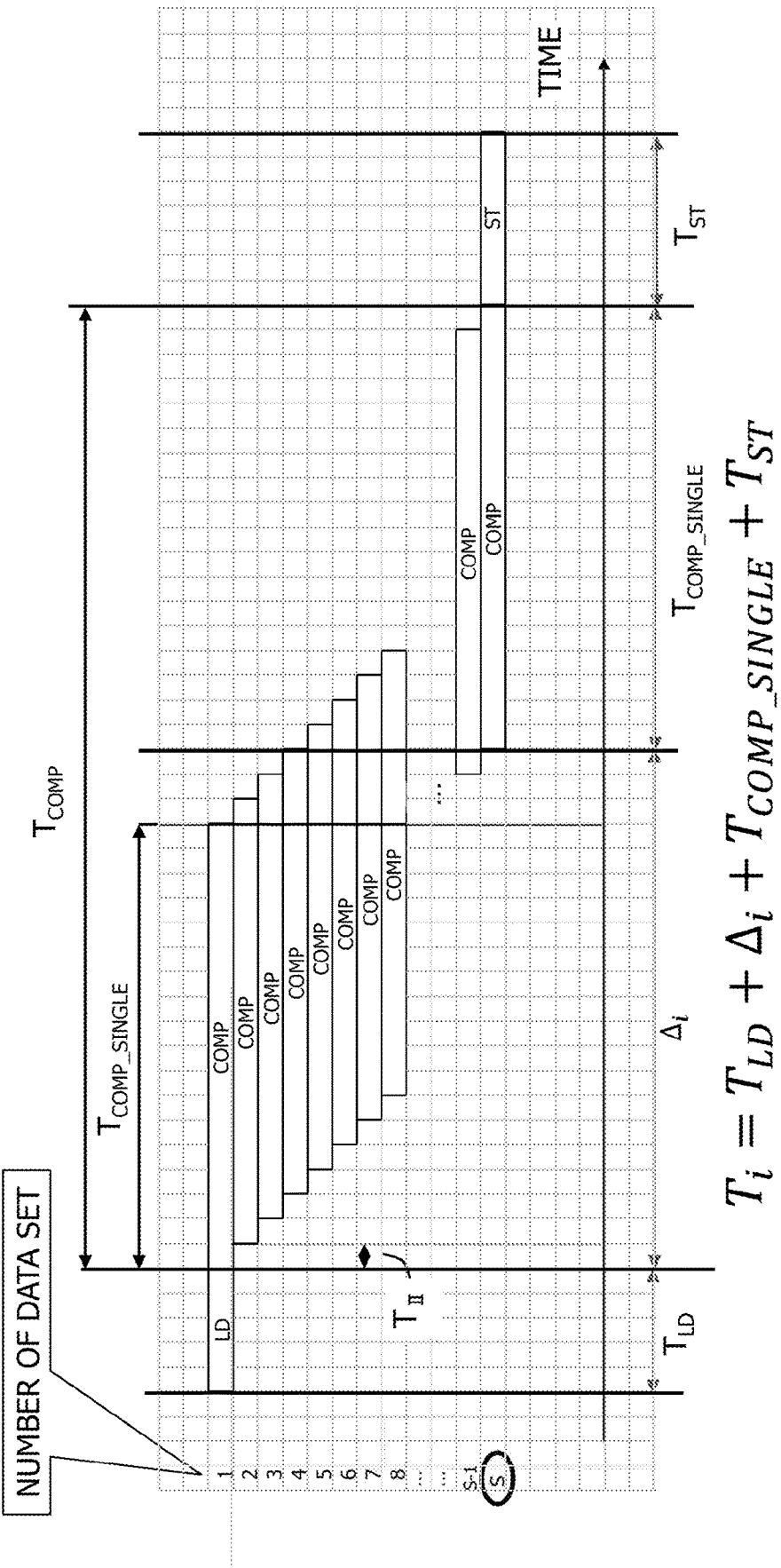
FIG. 8 is a diagram depicting the execution time in the case of the CI processing circuit.

FIG. 8 is a diagram depicting the execution time in the case of the CI processing circuit. The execution time of the CI processing circuit can be estimated by the number of times of execution N, the data set S that is processed in one execution, the load (read) time $T_{LD}$ of the input data, the store (write) time $T_{ST}$ of the output data, the processing time $T_{COMP\_SINGLE}$ of one data set, and the initiation interval $T_{II}$ which is the processing start interval of a plurality of data.

As depicted in FIG. 8, the CI processing circuit performs the processing LD, which loads the input data from the memory when execution starts, performs input data calculation processing COMP by pipeline processing for S number of times, and finally executes the processing ST to store the output data to the memory. Each of the S times of pipeline processing is started with the initiation interval $T_{II}$ respectively. The execution time of the calculation processing COMP of one data set is $T_{COMP\_SINGLE}$, and the initiation interval $T_{II}$ of the S times of data set calculation is $\Delta i$. As mentioned above, in the CI processing circuit, the data load LD and the data store ST are generated at the beginning and end of the data processing, and memory access is rarely generated during the data processing COMP.

Therefore the execution time Ti of the i-th execution, out of N times of executions included in one job, is as follows.

$$Ti = T_{LD} + \Delta i + T_{COMP\_SINGLE} + T_{ST} \quad \text{Expression 1}$$

Here $\Delta i$ is (S−1) times $T_{II}$, which is as follows.

$$\Delta i = T_{II} * (S-1)$$

Further, when the degree of parallelism of the CI processing circuit is Pi, $\Delta i$ is decreased in accordance with the degree of parallelism Pi.

$$\Delta i = T_{II} * \{(S/Pi) - 1\}$$

Figure 9:
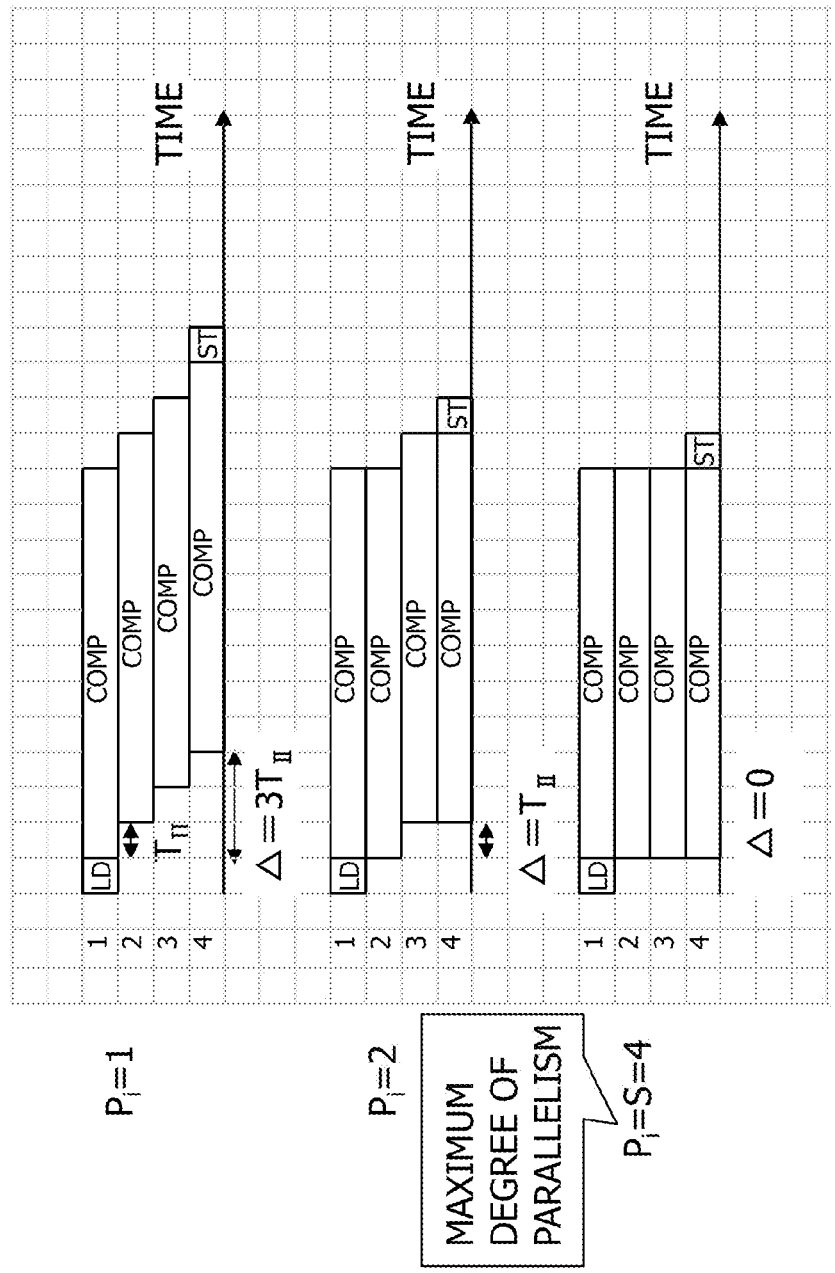
FIG. 9 is a diagram depicting the difference of the execution time of the CI processing circuit when the degree of parallelism Pi is changed.

FIG. 9 is a diagram depicting the difference of the execution time of the CI processing circuit when the degree of parallelism Pi is changed. In the example of FIG. 9, the data set S is S=4. Then the cases when the degree of parallelism Pi is Pi=1, Pi=2 and Pi=S=4, Δ is depicted. In the case of Pi=1, $\Delta i = 3*T_{II}$, in the case of Pi=2, $\Delta i = T_{II}$, and in the case of Pi=S=4, $\Delta i = 0$.

As described above, the i-th execution time Ti, in the case of the CI processing circuit, is as follows, based on the above Expression 1, when the degree of parallelism is Pi.

[Math. 1]

$$\Delta_i = T_{II} \times \left(\frac{S}{P_i} - 1\right) \quad \text{(Expression 1)}$$

$$T_i = T_{LD} + \Delta_i + T_{COMP\_SINGLE} + T_{ST}$$

$$= T_{LD} + T_{II} \times \left(\frac{S}{P_i} - 1\right) + T_{COMP\_SINGLE} + T_{ST}$$

The memory access time $T_{LD}$ and $T_{ST}$ are sufficiently small compared with the data processing time, hence the execution time Ti becomes as follows, omitting $T_{LD}$ and $T_{ST}$ from Expression 1.

[Math. 2]

$$T_i = T_{II} \times \left(\frac{S}{P_i} - 1\right) + T_{COMP\_SINGLE} \quad \text{(Expression 2)}$$

The difference of the execution time when the degree of parallelism Pi of the circuit is changed to Pj (reduced time in the case of Pi<Pj) is as follows.

[Math. 3]

$$T_j - T_i = \left(T_{II} \times \left(\frac{S}{P_i} - 1\right) + T_{COMP\_SINGLE}\right) - \left(T_{II} \times \left(\frac{S}{P_j} - 1\right) + T_{COMP\_SINGLE}\right) \quad \text{(Expression 3)}$$

$$= T_{II} \times \frac{S \cdot (P_i - P_j)}{P_i \cdot P_j}$$

Further, when the degree of parallelism of the CI processing circuit is the maximum Pi=S in Expression 2, the execution time Ti becomes the minimum execution time $T_{min}$ as follows.

[Math. 4]

$$T_{min} = T_{II} \times \left(\frac{S}{P_i} - 1\right) + T_{COMP\_SINGLE} \quad \text{(Expression 2)}$$

If $P_i = S$, $$T_{min} = T_{II} \times \left(\frac{S}{S} - 1\right) + T_{COMP\_SINGLE} = T_{COMP\_SINGLE} \quad \text{(Expression 4)}$$

The total execution time $T_{CI\_total}$ of N number of times of execution of the CI processing circuit is as follows, when the degree of parallelism at the i-th execution is Pi.

[Math. 5]

$$T_{CI\_total} = \sum_{i=1}^{N} T_i = \sum_{i=1}^{N} \left(T_{II} \times \left(\frac{S}{P_i} - 1\right) + T_{COMP\_SINGLE}\right) \quad \text{(Expression 5)}$$

In the above Expression 5, the total execution time $T_{CI\_total\_before}$ before changing the degree of parallelism from Pi to Pj, and the total execution time $T_{CI\_total\_after}$ after changing the degree of parallelism from Pi to Pj are determined by Expression 5, where the degree of parallelism is set to Pi or Pj respectively.

When the degree of parallelism Pi is the maximum value S (Pi=S) in all the N times of execution (Pi=S in all the elements i of [1:N]), the total execution time becomes the following minimum value $T_{CI\_total\_min}$.

[Math. 6]

$$T_{CI\_total\_min} = \sum_{i=1}^{N} T_{min} = N \cdot T_{COMP\_SINGLE} \quad \text{(Expression 6)}$$

The degree of parallelism of the DI processing circuit and the execution time will be described next. In the DI processing circuit, the data load LD and the data store ST are generated during the data processing COMP of each data set as well. Therefore in the DI processing circuit, most of the execution time Ti does not becomes the arithmetic processing time $T_{COMP\_SINGLE}$, unlike the CI processing circuit. Therefore in this embodiment, the DI processing circuit calculates the execution time based on the assumption that increasing the degree of parallelism to N times decreases the execution time to 1/N times.

In this embodiment, when a bus bottleneck is generated, the bus bottleneck is cleared by decreasing a degree of parallelism of a predetermined user circuit, and a degree of parallelism of a user circuit that is different from the predetermined user circuit is increased instead. In this case, the total $T_{total\_before}$ of the execution time of all the user circuits before adjusting the degree of parallelism and the total $T_{total\_after}$ of the execution time of all the user circuits after adjusting the degree or parallelism are compared, then it is determined whether the degree of parallelism is adjusted. In other words, the degree of parallelism is adjusted to clear a bottleneck if the total $T_{total\_after}$ after adjustment is shorter than the total $T_{total\_before}$ before adjustment, and if not, the degree of parallelism is not adjusted.

The above mentioned $T_{total\_before}$ and $T_{total\_after}$ are both the total of the execution times of the CI processing circuit and the DI processing circuit.

$$T_{total\_before} = T_{DI\_total\_before} + T_{CI\_total\_before}$$

$$T_{total\_after} = T_{DI\_total\_after} + T_{CI\_total\_after}$$

The execution time of the CI processing circuit after adjusting the degree of parallelism is estimated by the above mentioned Expressions 5 and 6. The execution time of the DI processing circuit after adjusting the degree of parallelism, on the other hand, is estimated by multiplying the measured values of the execution time before adjustment by 1/N times—is the reciprocal of the degree of parallelism N times. The CI processing circuit and the DI processing circuit are discerned when the processing program is compiled, for example. It may be determined based on the measured values of the used band, so that the circuit, in which the band is used only at the beginning and end of the data processing, is determined as the CI processing circuit, and the other circuits as DI processing circuits.

General Processing of FPGA Management Program

Figure 10:
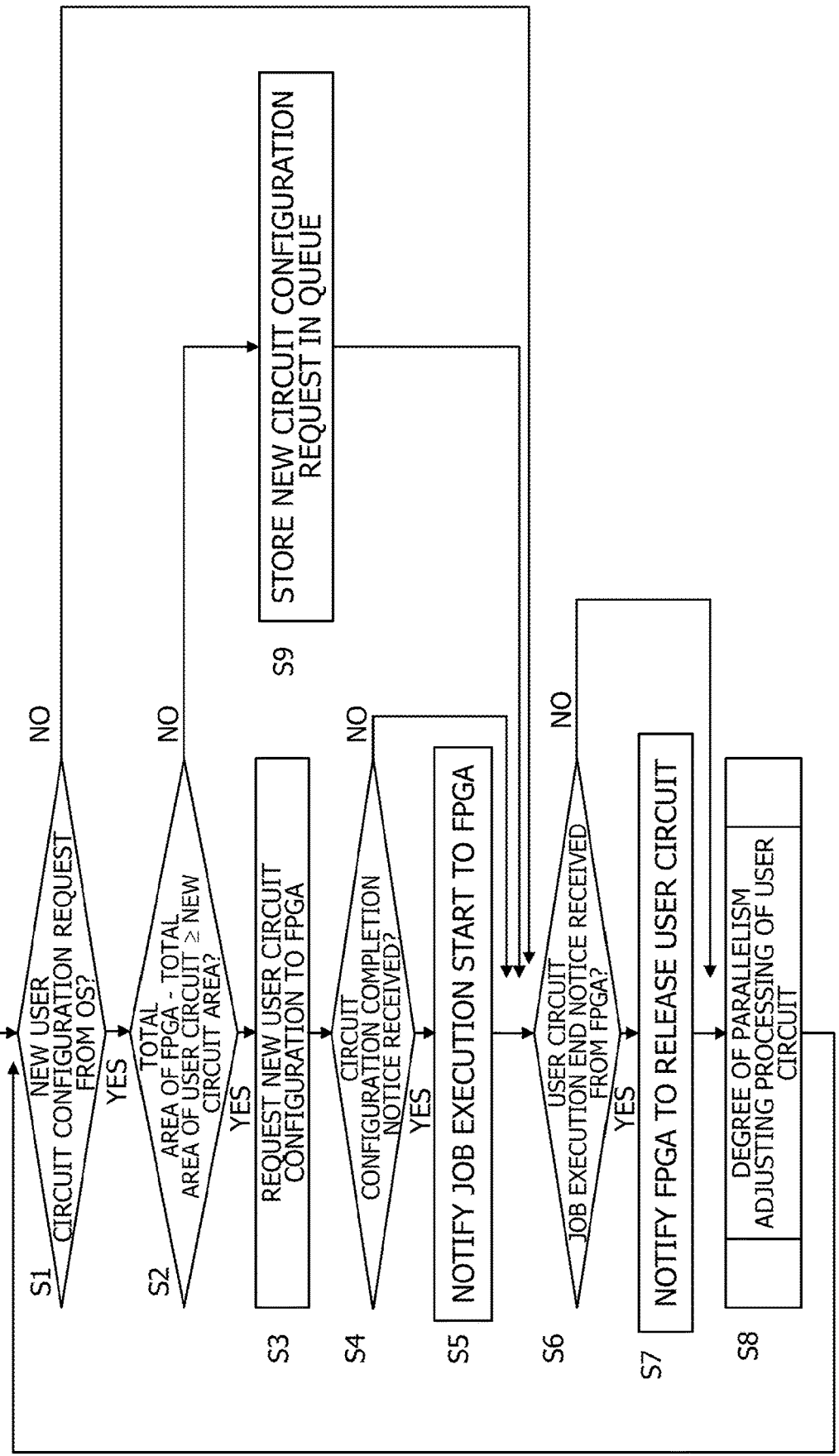
FIG. 10 is a flow chart of the FPGA management program according to Embodiment 1.

FIG. 10 is a flow chart of the FPGA management program according to Embodiment 1. For example, in the job management program of the operating system (OS), a job of the user application program executed by the processor is monitored, and if the job can be processed by the logic circuit in the FPGA, an interrupt, to request configuration of a new user circuit to the processor, is generated.

When a request to configure a new user circuit is received from OS (YES in S1), the processor that executes the FPGA management program processes the request as follows. First the processor determines whether the value, generated by subtracting the total surface area of the operating user circuits from the total surface area of the reconfiguration region of the FPGA, is greater than the value of the surface area of the new user circuit (S2). The total surface area of the reconfiguration region of the FPGA is a number of partial reconfiguration blocks PB, for example, and the total surface area of the operating user circuits is a number of partial reconfiguration blocks, in which the operating user circuits are configured, for example.

If the result of step S2 is YES, the processor requests the FPGA to configure the new user circuit (S3). If the configuration completion notice of the new user circuit is received from the FPGA (YES in S4), the processing notifies the start of the job in the user circuit to the FPGA (S5). If the result of step S2 is NO, on the other hand, the processor does not request the FPGA to configure the new user circuit, but stores the circuit configuration request in a request queue (request waiting queue) (S9). The requests in the request queue are checked as new user circuit configuration request in the above mentioned step S1 in the next cycle.

When the execution completion notice of the job in the user circuit is received from the FPGA (S6), the processor notifies the FPGA to release the user circuit in which the job is completed (S7). Thereby the control circuit in the FPGA releases the user circuit configured in the reconfiguration region.

Further, the processor executes a degree of parallelism adjusting processing in S8 in the user circuit. The degree of parallelism adjusting processing of the user circuit will be described later. Then the processor executes the above mentioned step S1 to S8 repeatedly.

Parameters of User Circuit

Before describing the degree of parallelism adjusting processing S8, examples of various parameters of the user circuit managed by the processor will be described first.

FIG. 11 is a table of parameters of the user circuit managed by the processor. In the table in FIG. 11, the values of the degree of parallelism P of the logic circuit, the estimated configuration time CT_E, the estimated execution time ET_E, the estimated used band BD_E, the measured execution time ET_M, and the measured used band BD_M are listed for the user circuits UC_1, UC_2, UC_3 and UC_4 respectively, which are configured in the reconfiguration region of the FPGA.

The estimated configuration time CT_E is an estimated value of the time that is needed to download the configuration data of a logic circuit from the FPGA memory, and set the configuration data in the configuration data memory C_RAM in the FPGA. The estimated execution time ET_E is an estimated value of the time until execution of one job by the logic circuit completes. The estimated used band BD_E is an estimated value of the bus band (data transfer amount) per unit time, which is used while the logic circuit is executing the job, in MB/s units.

The measured execution time ET_M and the measured used band BD_M, on the other hand, are measured values by an execution time measuring circuit and a data transfer amount measuring circuit respectively, which are disposed in the logic circuit.

The upper limit value of the band of the FPGA bus is assumed to be BD_L. This upper limit value BD_L of the band is a band of the FPGA bus, and the total of the data transfer amounts to the FPGA bus of the logic circuits configured in the reconfiguration region is not able to exceed this upper limit value BD_L of the band. Therefore when the total of the data transfer amounts of the logic circuits configured in the reconfiguration region reaches the upper limit value BD_L of the band or a value a bit lower than the upper limit value, it is assumed that a bottleneck is generated on the bus band. The total of the data transfer amounts normally varies, therefore, the total may reach the upper limit value or be just close to the upper limit value when bottleneck is generated.

Further, for each of the user circuits UC_1, UC_2, UC_3 and UC_4, the parameters in FIG. 11 indicate the circuit type, either circuit type computation intensive (CI) or data intensive (DI), which indicates the processing pattern of the circuit, a number of times of execution N by the user circuit for the job, a number of data sets S that are processed in one execution, the read time $T_{LD}$ of the input data, the write time $T_{ST}$ of the output data, the processing time $T_{COMP\_SINGLE}$ of one data set, and the initiation interval time $T_{II}$ of the pipeline circuits.

In the degree of parallelism adjusting processing S8 of the logic circuit of the user, the processor controls the degree of parallelism of the logic circuit of the user in the reconfiguration region of the FPGA based on the values listed in FIG. 11.

Figure 12:
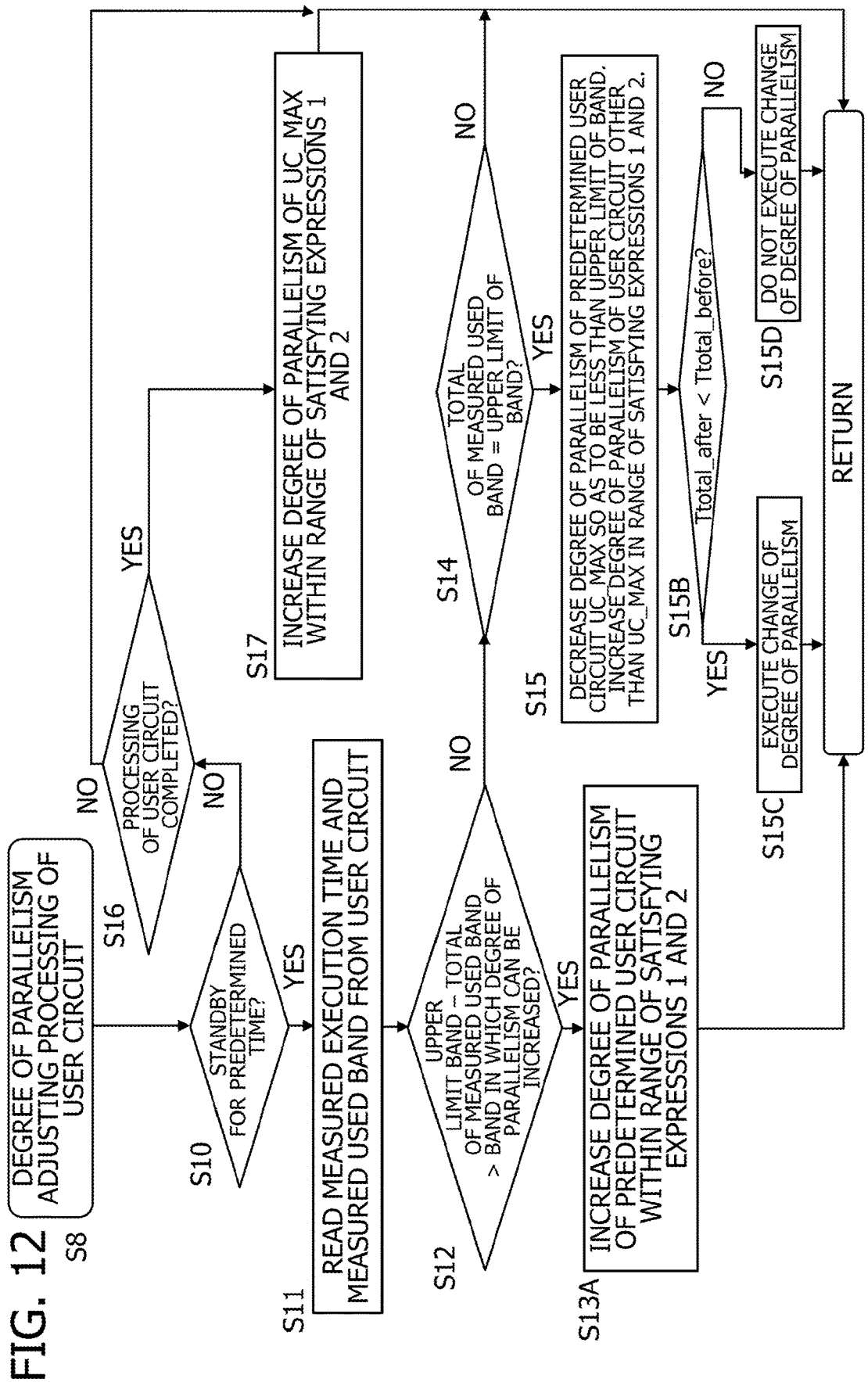
FIG. 12 is a flow chart of the degree of parallelism adjusting processing S8 of the user circuit.

FIG. 12 is a flow chart of the degree of parallelism adjusting processing S8 of the user circuit. As each predetermined standby time elapses (YES in S10), the processor that executes the FPGA management program reads the measured execution time ET_M and the measured used band BD_M, which the execution time measuring circuit and the used band measuring circuit of the user circuit configured in FPGA are measuring, from these circuits, or receives [these values ET_M and BD_M] from the control circuit 151 in the FPGA (S11).

Control to Increase Degree of Parallelism

The processor determines whether a value generated by subtracting the total value of the measured used band of the user circuit from the upper limit of the band BD_L of the FPGA bus is greater than the minimum band that is needed to increase a degree of parallelism of any user circuit configured in the FPGA (S12). If the result of step S12 is YES, the processor increases the degree of parallelism of the user circuit within a range of satisfying the following Expressions 1 and 2 (S13A).

Figure 13:
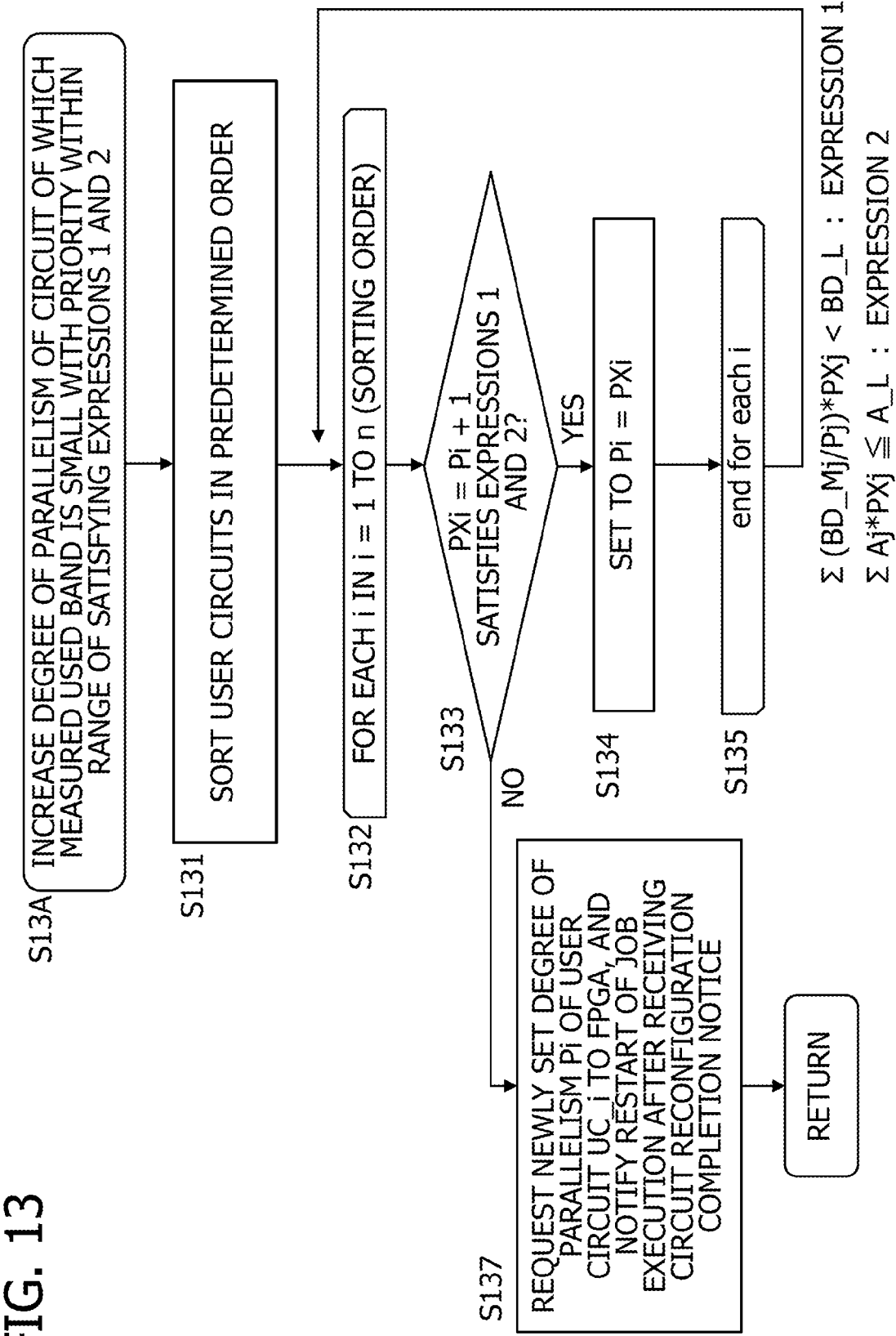
FIG. 13 is a flow chart depicting the processing to increase the degree of parallelism in step S13A.

FIG. 13 is a flow chart depicting the processing to increase the degree of parallelism in step S13A. First the processor sorts a plurality (n) of user circuits in a predetermined order (e.g. from the smaller to the larger measured used bands BD_M) (S131). The order of each sorted user circuit is assumed to be coefficient i=1 to n. Then the processor determines, for each i of the coefficient i=1 to n, in the sorted order, that is, in the order of the coefficient (S132 to S135), whether the following Expression 1 and Expression 2 are satisfied by the degree of parallelism PXi (=Pi+1), which is generated by adding 1 to the degree of the parallelism Pi of the i-th user circuit to be processed (S133).

Expression 1 and Expression 2 are as follows (refer to FIG. 11).

$$\Sigma(BD\_Mj/Pj)*PXj<BD\_L \qquad \text{(Expression 1)}$$

$$\Sigma(Aj*PXj) \le A\_L \qquad \text{(Expression 2)}$$

Here Σ denotes the total of all the user circuits j=1 to n. PXj in Expression 1 and Expression 2 is PXj=Pj+1 if j=i, and PXj=Pj if j≠i, that is, the degree of parallelism Pj is increased +1 only for the i-th user circuit to be processed, and remains as the degree of parallelism Pj for the user circuits other than the i-th user circuit.

In other words, Expression 1 is as follows, in the case of n=4 and i=2.

$$(BD\_M1/P1)*P1+(BD\_M2/P2)*PX2+(BD\_M3/P3)\\*P3+(BD\_M4/P4)*P4<BD\_L$$

The first term at the left hand side is (BD_M1/Pi) *P1=BD_M1, and the third and fourth terms are the same, therefore $$BD\_M1+(BD\_M2/P2)*PX2+BD\_M3+BD\_M4<BD\_L.$$

Aj in Expression 2 is the circuit area (e.g. number of partial reconfiguration blocks) of the user circuit of which degree of parallelism is 1, and A_L is the total circuit area (e.g. total number of partial reconfiguration blocks) of the reconfiguration region. When n=4 and i=2, Expression 2 is as follows.

$$A1*P1+A2*PX2+A3*P3+A4*P4 \le A\_L$$

When Expression 1 is satisfied, this means that the total of the used bands of all the user circuits, after the degree of parallelism Pi is increased by 1 only for the i-th user circuit to be processed, is smaller than the upper limit value BD_L of the band of the FPGA bus. In Expression 1, (BD_M2/P2)*PX2 means that the measured used band is in proportion to the degree of parallelism. When Expression 2 is satisfied, on the other hand, this means that the total of the area used by all the user circuits, after the degree of parallelism Pi is increased by 1 only for the i-th user circuit to be processed, is not more than the total circuit area A_L of the FPGA.

If the result of step S133 is YES (YES in S133), the processor sets the increased degree of parallelism PXi to the degree of parallelism Pi of the user circuit UC_i (S134). When the result of step S133 is YES in all the coefficient i=1 to n, this means that the degree of parallelism Pi was increased +1 for all user circuits.

If the result of step S133 is NO in any of 1 to n of the coefficient i (NO in S133), on the other hand, the loop of S132 to S135 is exited. In other words, the degree of parallelism is increased +1 in the order of the user circuits, and the processing in the loop S132 to S135 ends if the result in step S133 becomes NO in a certain user circuit.

Then the CPU sends a request to the FPGA to reconfigure the user circuit UC_i with the newly set degree of parallelism Pi=PXi, and after receiving the reconfiguration completion notice of the user circuit, the CPU notifies the FPGA to restart execution of the job of the user circuit (S137).

In FIG. 13, it is also possible that the user circuits are sorted from the smaller to the larger measured used bands, and the degree of parallelism of a user circuit, of which measured used band is small, is increased with priority, and when Expression 1 is not satisfied in a certain user circuit, it is determined again whether the degree of parallelism of the circuit of which measured used bands is smaller can be increased. In this case, the used band can be kept to be less than the upper limit of the bus band, since, in general, the increase amount of a used band, when the degree of parallelism is increased +1, tends to be smaller as the measured used band is smaller. Therefore the execution time of the job is further decreased by increasing the degree of parallelism of such a user circuit, so as to complete the execution of the job more quickly. If the job execution by the user circuit is completed, the execution time of the jobs by other user circuits may be decreased thereafter by increasing the degree of parallelism of these other user circuits.

Decrease in Degree of Parallelism of User Circuit that May be Causing Bottleneck on Bus Band, and Increase in Degree of Parallelism of Another User Circuit

Referring back to FIG. 12, when the result of step S12 is NO, the processor determines whether the total of the measured used band reached the upper limit of the band of the FPGA bus or a value a bit lower than the upper limit (S14). If the result of this step S14 is YES, this means that a bottleneck is generated on the band of the FPGA bus.

Then the processor decreases the degree of parallelism of a predetermined user circuit UC_MAX so that the used band becomes less than the upper limit of the band (S15). For the predetermined user circuit UC_MAX, a user circuit, of which measured used band is the largest, is selected (first example). The processor calculates the estimated used band of the predetermined user circuit UC_MAX, and selects a decreased amount of the degree of parallelism with which the total, with the measured used band of the other user circuits, does not reach the limit of the band. A DI processing circuit is often selected as the user circuit of which measured used band is large.

For the predetermined user circuit UC_MAX, a user circuit, of which difference between the estimated execution time ET_E and the measured execution time ET_M is the greatest, is selected (second example). It is more likely that this user circuit is unable to use the band of the FPGA bus as much as the estimated used band BD_E due to bus bottleneck. Therefore by decreasing the degree of parallelism of this user circuit, the state of an inefficient configuration in the FPGA, where a part of the user circuits are not adequately operating due to the bus bottleneck, can be improved.

To select a target user circuit of which degree of parallelism is decreased, a user circuit, of which difference between the estimated used band BD_E and the measured used band BD_M is the largest, may be selected (third example). In this case, the user circuit of which difference is the largest is a user circuit which is not using the band of the FPGA bus as much as the estimated used band BD_E due to a bus bottleneck, hence this user circuit is selected as a target user circuit to decrease the degree of parallelism.

The degree of parallelism of a user circuit of which degree of parallelism is highest (fourth example) may be decreased. In this case, the user circuit, of which the degree of parallelism is the highest, is a user circuit which has priority over other circuits, hence this user circuit is selected as a target user circuit to decrease the degree of parallelism.

The processor decreases a degree of parallelism of a predetermined user circuit UC_MAX, and increases a degree of parallelism of user circuits other than the predetermined user circuit UC_MAX (S15). Various examples are possible to select a user circuit of which degree of parallelism is increased. In the first example, other user circuits are selected according to an arbitrary order, similarly to FIG. 13, so that the degree of parallelism increases in order within a range of satisfying Expression 1 and Expression 2. In other words, the degree of parallelism of an arbitrary user circuit, out of the user circuits other than the predetermined user circuit UC_MAX in the FPGA, is increased without distinguishing between a DI processing circuit and CI processing circuit.

In the second example, a CI processing circuit is selected with priority, and the degree of parallelism of the CI processing circuit is increased. The CI processing circuit has a small used band, hence the execution time is more likely to be decreased without exceeding the upper limit of the band. However, in some cases, the decrease of the execution time of a CI processing circuit is not be very large, as mentioned above.

In the third example, a circuit, of which the execution time is decreased considerably by increasing the degree of parallelism, is selected out of the CI processing circuits, then a part of the DI processing circuits is also selected, and a degree of parallelism is increased for both the selected CI processing circuit and the DI processing circuit. In this case, it is preferable that the execution time of the circuit, of which degree of parallelism was increased, is decreased, and after this execution completes, the degree of parallelism of the predetermined user circuit, of which degree of parallelism was decreased to clear the bus bottleneck, is increased, so that the total execution time can be decreased.

Then the processor calculates: the total of the execution time until the completion of the jobs of all the user circuits in the case when the degree of parallelism is not adjusted, (neither increased nor decreased) in step S15, the total execution time $T_{total\_before}$ before the adjustment (not-adjusted); and the total of this execution time in the case when the adjustment was performed, the total execution time $T_{total\_after}$ after the adjustment (adjusted); and determines whether $T_{total\_after} < T_{total\_before}$ is established (S15B).

If the determination result is YES, the processor executes adjustment of the degree of parallelism (S15C). If the determination result is NO, the processor does not execute adjustment of the degree of parallelism (S15D). In other words, the degree of parallelism of the user circuits is not adjusted without clearing the bus bottleneck state. A user circuit in the FPGA is configured in the FPGA during processing. Therefore when the total of the execution time until the jobs of all the user circuits completes decreases, the operation efficiency of the circuit resources of the FPGA increases. The processor performs the determination of step S15B, and determines whether the bus bottleneck state is cleared or not, based on whether the operation efficiency of the circuit resources of the FPGA increase or not.

Figure 14:
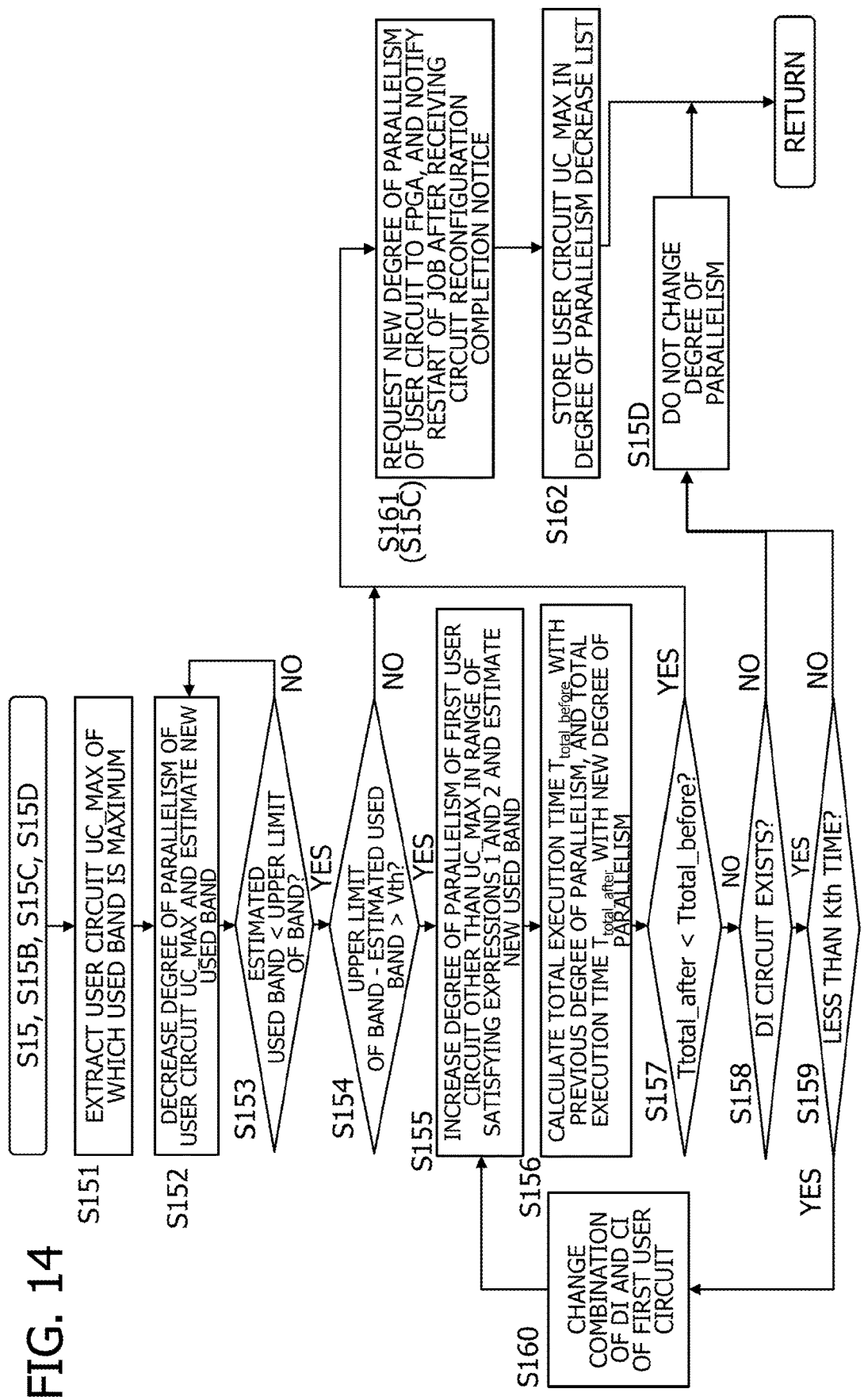
FIG. 14 is a detailed flow chart of steps S15, S15B, S15C and S15D in FIG. 12.

FIG. 14 is a detailed flow chart of steps S15, S15B, S15C and S15D in FIG. 12. As a processing to decrease the degree of parallelism of a predetermined user circuit UC_MAX, the processor extracts a user circuit UC_MAX of which measured used band is the largest (S151), decreases the degree of parallelism of this user circuit UC_MAX, and estimates a new used band by calculation. To estimate the new used band, it is estimated that decreasing the degree of parallelism to 1/N decreases the used band to 1/N times as well.

Then the processor determines whether the estimated used band becomes less than the upper limit (S153), and if the estimated used band is not less than the upper limit, the processor executes step S152 again, so as to further decrease the degree of parallelism. If the estimated used band is less than the upper limit (YES in S152), the processor determines whether the difference between the upper limit of the band and the total of the estimated used bands of all the user circuits exceeds a predetermined reference value Vth (YES in S154). If the difference exceeds this predetermined reference value Vth, the processor increases the degree of parallelism of user circuits other than the user circuit UC_MAX, and estimates the new used band of this user circuit (S155).

The processor estimates the total value $T_{total\_before}$ of the execution time of all the user circuits using the degree of parallelism before adjusting, (decreasing or increasing) the degree of parallelism (conventional degree of parallelism), and also estimates the total value $T_{total\_after}$ of the execution time of all the user circuits using the degree of parallelism after adjusting (decreasing or increasing) the degree of parallelism (new degree of parallelism) (S156). Then the processor compares the estimated values, and determines whether $T_{total\_after} < T_{total\_before}$ is established (S157).

If this determination result is YES (YES in S157), the processor requests the new degree of parallelism of the user circuit to the FPGA, and after the circuit reconfiguration completion notification is received, the processor notifies the restart of the job of the user circuit of which degree of parallelism was updated (S161). Even in the case when the determination result is NO in step S154 mentioned above, the processor executes step S161. Then the processor stores the user circuit UC_MAX in the degree of parallelism decrease list (S162).

If the result of determining whether $T_{total\_after} < T_{total\_before}$ is NO (NO in S157), on the other hand, the processor determines whether a DI processing circuit, of which degree of parallelism is not adjusted, is included in user circuits other than the user circuit UC_MAX of which degree of parallelism was decreased (S158). If included (YES in S158), the determination result in step S157 may become YES by increasing the degree of parallelism of the DI processing circuit, in place of the CI processing circuit. Therefore the processor changes the combination of the DI processing circuit and the CI processing circuit of the first user circuit of which degree of parallelism is increased (S160), and executes steps S155, S156 and S157 again.

For example, in the first user circuit, the execution time $T_{total\_after}$ after adjustment may become shorter than the execution time $T_{total\_before}$ before adjustment if the degree of parallelism of the DI processing circuit is increased, instead of increasing the degree of parallelism of the CI processing circuit. For example, it is preferable not to increase the degree of parallelism of a CI processing circuit of which circuit scale is large and of which execution time does not decrease significantly by increasing the degree of parallelism, among the first user circuits of which degree of parallelism was increased, and available circuit resources are secured, and a DI processing circuit is selected, in place of a CI processing circuit, to increase the degree of parallelism.

If the result in step S157 becomes YES, the processor executes steps S161 and S162, and executes the degree of parallelism adjustment processing.

If the result in step S157 is NO even if the combination of the DI processing circuit and the CI processing circuit in the first user circuit is changed K times (NO in S159), the processor does not decrease the degree of parallelism of the predetermined user circuit UC_MAX, or increase the degree of parallelism of the first user circuit for adjustment (S15D). Even in the case when the result in step S158 mentioned above is NO, the processor does not adjust the degree of parallelism of the user circuit, since it is unlikely that the determination result in step S157 will be reversed (S15D).

According to the flow chart in FIG. 14, the processor searches for a combination of the first user circuits by which the total execution time, in the state where the degree of parallelism of a predetermined user circuit UC_MAX was decreased to clear the bus bottleneck, and the degree of parallelism of another user circuit (first user circuit) was increased, is less than the total execution time in the state before the adjustment. Thereby both the bus bottleneck is cleared, and the circuit resources of the FPGA can be used effectively due to $T_{total\_after} < T_{total\_before}$.

Control to Increase Degree of Parallelism of User Circuit UC_MAX Referring back to FIG. 12, when a job execution completion notice is received from the user circuit (YES in S16) while standing by for a predetermined time (NO in S10), the processor performs control to increase the degree of parallelism of the user circuit UC_MAX within a range of satisfying Expression 1 and Expression 2 (S17). If the job execution completion notice is not received while standing by for a predetermined time, the processor ends the degree of parallelism adjusting processing S8 of the user circuit.

Figure 15:
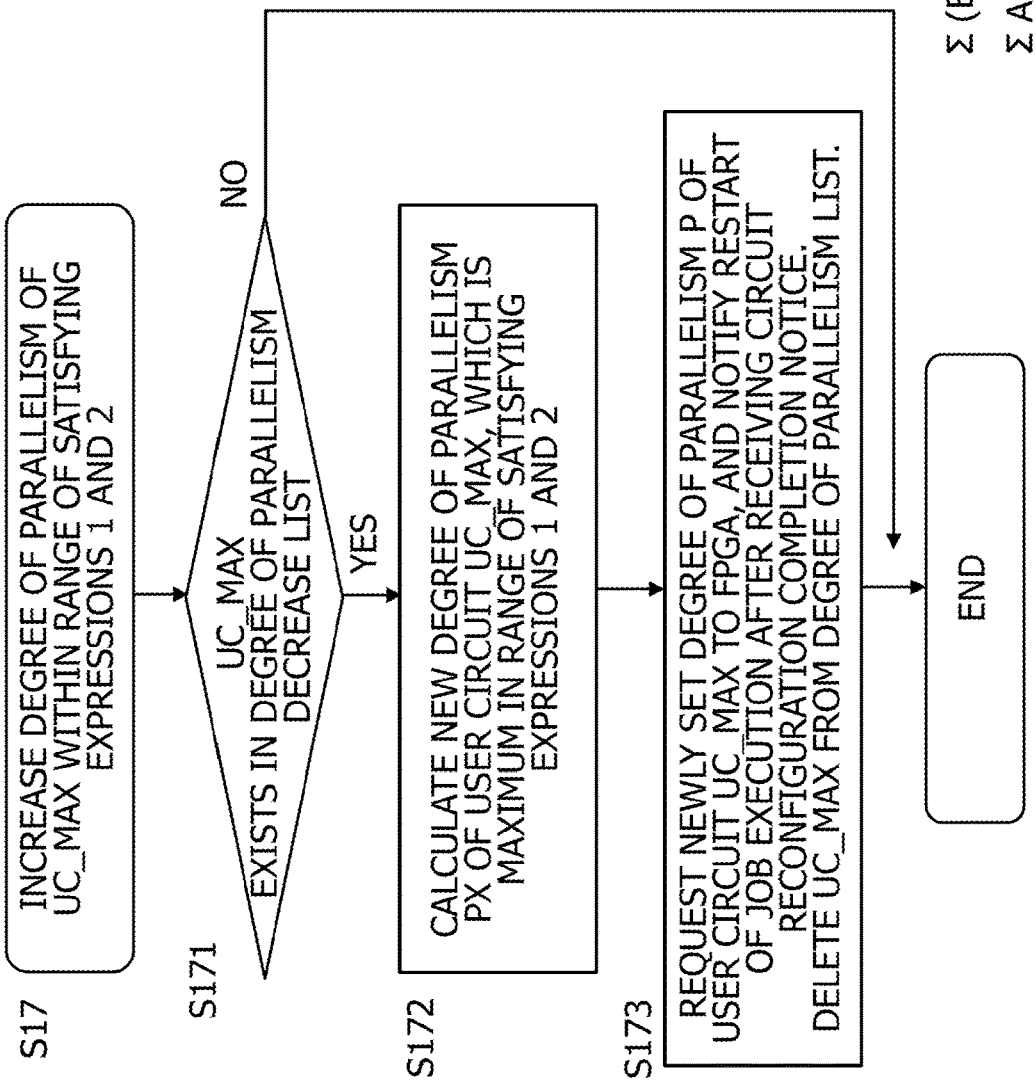
FIG. 15 is a flow chart depicting the processing in step S17.

FIG. 15 is a flow chart depicting the processing in step S17. When the job execution completion notice is received from the user circuit (YES in S16 in FIG. 12), the processor determines whether the user circuit UC_MAX exists in the degree of parallelism decrease list (S171). If this circuit exists (YES in S171), the processor newly calculates the maximum degree of parallelism PX of the user circuit UC_MAX within a range of satisfying Expression 1 and Expression 2 (S172). Expression 1 and Expression 2 in FIG. 15 are the same as Expression 1 and Expression2 in FIG. 13. Here, however, a user circuit completes the job execution and is released right before, hence the released user circuit is excluded from Expression 1 and Expression 2. The target user circuit to increase the degree of parallelism is a predetermined user circuit UC_MAX.

For example, if the circuit UC_2 of user 2 is stored in the degree of parallelism decrease list, and execution of the jobs by circuit UC_1 of user 1 and circuit UC_3 of user 3 are completed, Expression 1 and Expression 2 become as follows.

$$(BD\_M2/P2)*PX2+BD\_M4<BD\_L \text{(Expression1)}$$

$$A2*PX2+A4*P4 \leq A\_L \text{(Expression2)}$$

The processor newly calculates the maximum degree of parallelism PX2 in the range of satisfying Expression 1. Thereby the user circuit UC_MAX (UC_2) can be controlled to increase the degree of parallelism with priority when the execution of the other user circuits complete.

Then the processor requests the FPGA to configure the logic circuit using the new degree of parallelism PX of the user circuit UC_MAX, and notifies to restart the execution of the job when the circuit reconfiguration completion notice is received (S173). Further, the processor deletes the user circuit UC_MAX, of which degree of parallelism was increased, from the degree of parallelism decrease list (S173).

Referring back to FIG. 12, a summary of the degree of parallelism adjusting control of the used circuits by the processor is as follows. The processor acquires the measured execution time ET_M and the measured used band BD_M from the measuring circuits of the user circuits in the FPGA at every predetermined time (S11). When the difference between the total of the measured used band of all the user circuits and the upper limit value of the band of the FPGA bus is larger than the amount of band that is needed to increase the degree of parallelism (YES in S12), the processor increases a degree of parallelism of a certain user circuit within a range of satisfying Expression 1 and Expression 2 (S13A). If the user circuit UC_MAX, of which degree of parallelism was decreased, does not exist (NO in S171 in FIG. 15 showing S17), when the certain user circuit completes the execution of the job (YES in S16), the determination result in step S12 based on the measured used band BD_M becomes YES in the next measurement cycle, and the processor increases the degree of parallelism of the predetermined user circuit again with priority in the range of satisfying Expression 1 and Expression 2 (S13A).

On the other hand, when the total value of the measured used band has reached or been closer to the upper limit value of the band of the FPGA bus (YES in S14), the processor selects a predetermined user circuit UC_MAX which is likely causing the bottleneck of the FPGA bus band, and decreases the degree of parallelism thereof, so as to clear the bus bottleneck (S15). For the user circuit UC_MAX of which degree of parallelism is decreased, a DI processing circuit, of which used band is large, for example, is selected. Then the processing increases the degree of parallelism for user circuits other than the user circuit UC_MAX within a range of satisfying Expression 1 and Expression 2 (S15). For a user circuit of which the degree of parallelism is increased, a CI processing circuit of which used band is small, for example, is selected.

Then the processor changes the degree of parallelism when the total estimated execution time of all the user circuits, after the degree of parallelism is adjusted, is shorter than the total estimated execution time of all the user circuits before the degree of parallelism is adjusted (S15C), and if not, does not change the degree of parallelism (S15D).

Furthermore, when execution of the job of a certain user circuit completes (YES in S16), the processor increases the degree of parallelism of the user circuit UC_MAX, of which the degree of parallelism was decreased, to the maximum degree of parallelism in the range of satisfying Expression 1 and Expression 2 (S17). Thereby the processor temporarily decreases the degree of parallelism of the user circuit UC_MAX which is likely causing a bottleneck on the bus band, but the degree of parallelism of another user circuit is increased, hence the total execution time becomes short. When the execution of the job of the other user circuit completes (YES in S16), the processor again increases the degree of parallelism of the user circuit UC_MAX of which degree of parallelism was temporarily decreased. As a result, by adjusting the degree of parallelism when the bus bottle neck is generated, the bus bottleneck is cleared, and the total execution of all the user circuits may decrease.

Example of Adjustment of Degree of Parallelism

Figure 16:
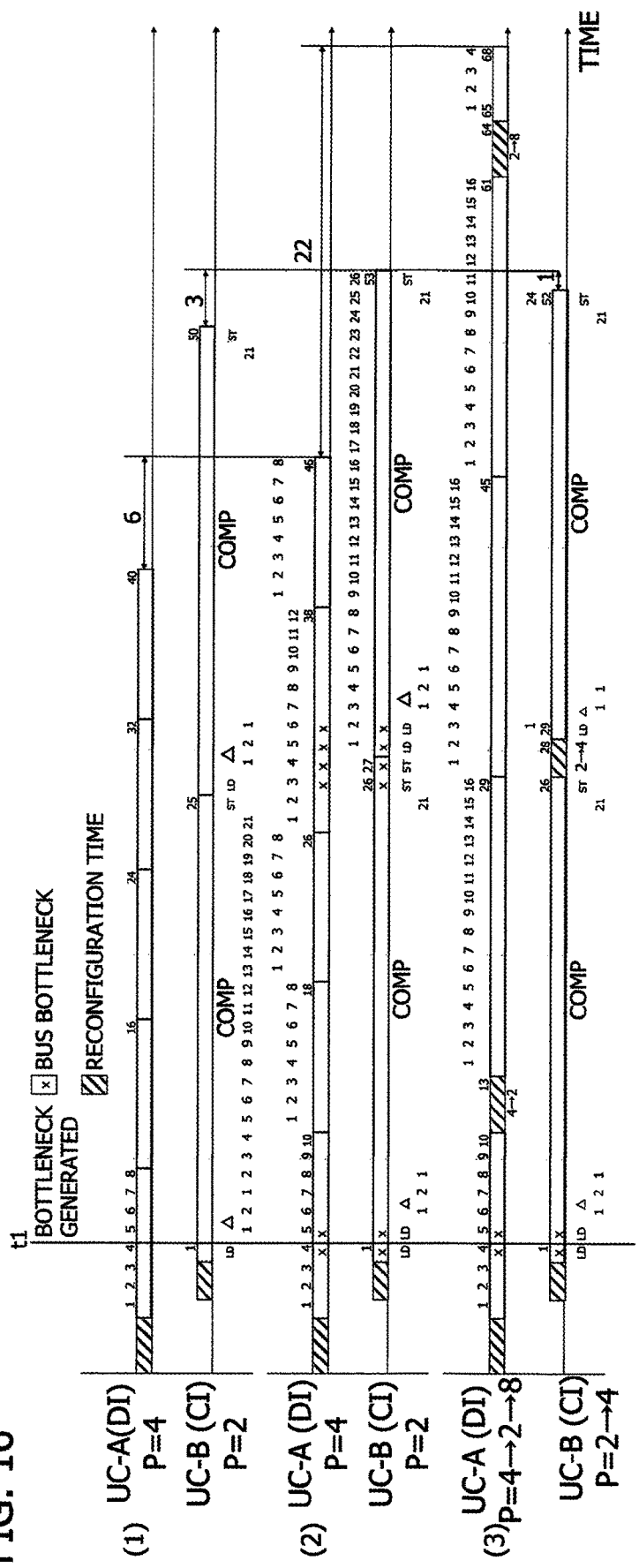
FIG. 16 is a diagram depicting a first example.

FIG. 16 is a diagram depicting a first example. The abscissa indicates time TIME, and the ordinate indicates, respectively, (1) the estimated execution time when the bus bottleneck is not generated, (2) the estimated execution time when the bus bottleneck is generated, but the degree of parallelism is not adjusted, and (3) the estimated execution time when the bus bottleneck is generated and the degree of parallelism is adjusted. The first example is the simplest case when the user circuits UC-A and UC-B are configured in the FPGA, and the user circuit UC-A is a DI processing circuit, and the user circuit UC-B is a CI processing circuit.

In (1) of FIG. 16, the user circuit UC-A is a DI processing circuit, where the degree of parallelism P=4, the execution time of one execution is 8, and a job completes when execution is performed five times. The user circuit UC-B is a CI processing circuit, where the degree of parallelism P=2, the execution time of one execution is 25 ($T_{LD}$=1, initiation interval Δ=2, $T_{COMP}$=21, $T_{ST}$=1), and the job completes when execution is performed twice.

In the case when the bus bottleneck is generated, but the degree of parallelism is not executed, as in (2) mentioned above, the bus bottleneck is generated at time t1 and the memory access takes time in the user circuits UC-A and UC-B. Even if the bus bottleneck is generated, the degree of parallelism is not changed for both user circuits. As a result, the execution time of the user circuit UC-A becomes longer by 6, and the execution time of the user circuit UC-B becomes longer by 3.

In the case when the bus bottleneck is generated and the degree of parallelism is adjusted, as in (3) mentioned above, the degree of parallelism P of the user circuit UC-A is decreased from 4 to 2, which increases the execution time of one execution from 8 to 16 (doubles). Then the degree of parallelism P of the user circuit UC-B is increased from 2 to 4 (doubles), but the initiation interval Δ decreased only from 2 to 1, and the execution time of one execution slightly decreased from 25 to 24, since the user circuit UC-B is an CI processing circuit. After the execution of the user circuit UC-B ends, the degree of parallelism P of the user circuit UC-A is changed from 2 to 8, then the final execution time becomes shortened to 4.

In a comparison of the total of the execution time of the two user circuits between the case of (2) and case of (3), the user circuit UC-A becomes longer by 22, and the user circuit UC-B becomes shorter by 1 in case of (3), hence the total execution time $T_{total\_after}$ after the adjustment in (3) is longer than the total execution time $T_{total\_before}$ before adjustment in (2). Therefore when the bus bottleneck is generated, the processor determines that the degree of parallelism of the user circuit is not adjusted.

FIG. 17 is a diagram depicting a second example. The abscissa in (1), (2) and (3) is the same as FIG. 16. In the second example, a user circuit UC-C is further configured in the FPGA, in addition to the user circuits UC-A and UC-B, and the user circuits UC-A and UC-C are DI processing circuits, and the user circuit UC-B is a CI processing circuit.

In (1) of FIG. 17, the user circuits UC-A and UC-B are the same as FIG. 16. The user circuit UC-C is a DI processing circuit, where the degree of parallelism P=3, the execution time of one execution is 12, and a job completes when execution is performed four times.

In the case when the bus bottleneck is generated, but the degree of parallelism is not adjusted, as in (2) mentioned above, the bus bottleneck is generated at time t1 and the memory access takes time in the user circuits UC-A, UC-B and UC-C. Even if the bus bottleneck is generated, the degree of parallelism is not changed for all the user circuits. As a result, the execution time of the user circuit UC-A becomes longer by 6, the execution time of the user circuit UC-B becomes longer by 3, and the user circuit UC-C becomes longer by 6.

In the case when the bus bottleneck is generated and the degree of parallelism is adjusted, as in (3) mentioned above, the degree of parallelism P of the user circuit UC-A is decreased from 4 to 2, which increases the execution time of one execution from 8 to 16 (doubles). As described in the first example, the execution time is not decreased significantly, even if the degree of parallelism of the user circuit UC-B is increased, hence the degree of parallelism P of the user circuit UC-B is still 2. Instead, the degree of parallelism P of the user circuit UC-C is changed from 3 to 4. As a result, the reconfiguration time is not generated in the user circuit UC-B, and the execution time of one execution is 25, the same as (1), but in the user circuit UC-C, the execution time becomes shorter, from 12 to 9. This is an example when the degree of parallelism can be increased within the upper limit of the band, since the used band of the user circuit UC-C is small.

After the execution of the user circuit UC-C ends, the degree of parallelism P of the user circuit UC-A is changed from 2 to 8, then the execution time in the final three times of execution decrease to 4 respectively.

In comparison of the total of the execution time of the two user circuits between the case of (2) and case of (3), the user circuit UC-A becomes longer by 14, the user circuit UC-B becomes shorter by 3, and the user circuit UC-C becomes shorter by 12. As a result, the total execution time $T_{total\_after}$ after the adjustment in (3) is shorter than the total execution time $T_{total\_before}$ before adjustment in (2). Therefore when the bus bottleneck is generated, the processor determines that the degree of parallelism of the user circuit is adjusted.

In the case of the second example, when a bus bottleneck is generated, the bus bottleneck is cleared by decreasing the degree of parallelism of the user circuit UC-A, which is a DI processing circuit, and the degree of parallelism of the user circuit UC-C, which is not a CI processing circuit but a DI processing circuit, is increased, utilizing the remaining band of the bus and the circuit resources in the FPGA. In this case, the total execution time after adjustment is shorter than before adjustment, hence it is determined that the degree of parallelism is adjusted.

As described above, according to this embodiment, when a bus bottleneck is generated, the processor temporarily decreases the degree of parallelism of a predetermined user circuit to clear the bus bottleneck, increases the degree of parallelism of another user circuit using the increased circuit resources, and increases the degree of parallelism of the predetermined user circuit is increased when the execution of the other user circuit completes. Whether the degree of parallelism is adjusted like this or not is determined by comparing the total of the estimated execution time before adjustment and the total of the estimated execution time after adjustment.

Normally when a bus bottleneck is generated, the bus bottleneck is cleared, and an increase in the execution time can be suppressed by decreasing the degree of parallelism of a DI processing circuit of which the used band is large, and increasing the degree of parallelism of a CI processing circuit of which used band is small.

However, in the case of a CI processing circuit, the execution time is not decreased significantly, even if the degree of parallelism is decreased, and the total of the execution time is not shorted even if the degree of parallelism is adjusted. In this case, the processor determines that the degree of parallelism is not adjusted.

However, the degree of decreasing the execution time due to an increase in the degree of parallelism is depend on the circuits, therefore, in some cases, if a CI processing circuit, of which degree of decreasing the execution time due to an increase in the degree of parallelism is large, is selected, and the degree of parallelism thereof is increased, and another DI processing circuit which does not cause bus bottleneck is selected, and the degree of parallelism thereof is increased so as to decrease the execution time, then both solving the bus bottleneck and suppressing an increase in the execution time may be implemented.

In the above embodiment, when a bus bottleneck is generated, it is determined whether the degree of parallelism is adjusted by decreasing the degree of parallelism of a certain user circuit, and increasing the degree of parallelism of another user circuit, by comparing the total of the execution time between the state before adjustment and the state after adjustment. However, not only when the bus bottleneck is generated, but when the power consumption of the FPGA reaches the upper limit value (generation of bottleneck of power consumption) as well, it may be determined whether the degree of parallelism is adjusted by decreasing the degree of parallelism of a user circuit of which power consumption is high, and increasing the degree of parallelism of a user circuit of which power consumption is low, by comparing the total of execution time between the state before adjustment and the state after adjustment.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An information processing apparatus, comprising:
a processor that executes a program; and
a programmable logic circuit device (herein after called PLD) that includes a reconfiguration region to, in response to a configuration request from the processor, configure a logic circuit requested by the configuration request, wherein
the processor
compares a first execution time of a plurality of the logic circuits for a case when a degree of parallelism adjustment is performed by decreasing a degree of parallelism of a first logic circuit and increasing a degree of parallelism of a second logic circuit, out of the plurality of logic circuits, which are configured in the reconfiguration region and operates, and a second execution time of the plurality of logic circuits for a case when the degree of parallelism adjustment is not performed, and
requests the degree of parallelism adjustment to the PLD when the first execution time is shorter than the second execution time, and does not request the degree of parallelism adjustment to the PLD when the first execution time is not shorter than the second execution time.

2. The information processing apparatus according to claim 1, wherein the processor:
acquires measured values of the data transfer amounts of the plurality of logic circuits, which are configured in the reconfiguration region and operates, and
executes the comparison when a total of the data transfer amounts reaches the upper limit value of a data transfer amount of bus of the PLD.

3. The information processing apparatus according to claim 1, wherein the processor:
in the comparison, compares a total of the first execution time of the plurality of logic circuits and a total of the second execution time of the plurality of logic circuits, and
requests the degree of parallelism adjustment to the PLD when the total value of the first execution time is shorter than the total value of the second execution time, and
does not request the degree of parallelism adjustment to the PLD when the total value of the first execution time is not shorter than the total value of the second execution time.

4. The image processing apparatus according to claim 1, wherein
the processor calculates the first execution time and the second execution time of the plurality of logic circuits.

5. The information processing apparatus according to claim 4, wherein
the processor calculates, as the first execution time of the plurality of logic circuits, the execution time of the plurality of logic circuits that is estimated in a case when the degree of parallelism is adjusted by decreasing the degree of parallelism of the first logic circuit and increasing the degree of parallelism of the second logic circuit, and then increases the degree of parallelism of the first logic circuit after the execution of the second logic circuit is completed.

6. The information processing apparatus according to claim 4, wherein the plurality of logic circuits include one or both of a data intensive processing circuit, in which a memory access is generated during data processing, and a computation intensive processing circuit, in which a memory access is generated at the beginning and the end of the data processing, the processor:

calculates the first execution time so that the execution time becomes 1/N times when the degree of parallelism of the data intensive processing circuit is set to N times, and calculates the first execution time, so that an initiation interval time in pipeline processing of the computation intensive processing circuit becomes 1/N times when the degree of parallelism of the computation intensive processing circuit is set to N times.

7. The information processing apparatus according to claim 1, wherein the plurality of logic circuits include both a data intensive processing circuit, in which a memory access is generated during data processing, and a computation intensive processing circuit, in which a memory access is generated in the beginning and the end of the data processing, and the processor selects the first logic circuit from the data intensive processing circuit, and selects the second logic circuit from the computation intensive processing circuit.

8. The information processing apparatus according to claim 7, wherein when the first execution time is not shorter than the second execution time, the processor changes the second logic circuit and performs the comparison again.

9. The information processing apparatus according to claim 8, wherein when changing the second logic circuit, the processor selects the data intensive circuit in place of a computation intensive circuit, of which execution time is not decreased significantly by increasing the degree of parallelism in the second logic circuit.

10. A non-transitory computer storage medium that includes an administration program of a programmable logic circuit device (herein after called PLD) that includes a reconfiguration region to, in response to a configuration request from the processor, configure a logic circuit requested by the configuration request, for causing a processor to execute a process comprising:

comparing a first execution time of a plurality of the logic circuits for a case when a degree of parallelism adjustment is performed by decreasing a degree of parallelism of a first logic circuit and increasing a degree of parallelism of a second logic circuit, out of the plurality of logic circuits, which are configured in the reconfiguration region and operates, and a second execution time of the plurality of logic circuits for a case when the degree of parallelism adjustment is not performed, and requesting the degree of parallelism adjustment to the PLD when the first execution time is shorter than the second execution time, and not requesting the degree of parallelism adjustment to the PLD when the first execution time is not shorter than the second execution time.

11. A method of administrating a programmable logic device (herein after called PLD) of an information processing device including a processor executing a program and the PLD that includes a reconfiguration region to, in response to a configuration request from the processor, configure a logic circuit requested by the configuration request, the method comprising:

comparing a first execution time of a plurality of the logic circuits for a case when a degree of parallelism adjustment is performed by decreasing a degree of parallelism of a first logic circuit and increasing a degree of parallelism of a second logic circuit, out of the plurality of logic circuits, which are configured in the reconfiguration region and operates, and a second execution time of the plurality of logic circuits for a case when the degree of parallelism adjustment is not performed, and requesting the degree of parallelism adjustment to the PLD when the first execution time is shorter than the second execution time, and not requesting the degree of parallelism adjustment to the PLD when the first execution time is not shorter than the second execution time.

* * * * *